United States Patent
Nagahara et al.

(10) Patent No.: US 9,459,520 B2
(45) Date of Patent: Oct. 4, 2016

(54) LIGHT SOURCE UNIT AND OPTICAL ENGINE

(71) Applicant: Nichia Corporation, Anan-shi (JP)

(72) Inventors: Seiji Nagahara, Yokohama (JP); Takashi Sasamuro, Yamato (JP); Eiichiro Okahisa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 10 days.

(21) Appl. No.: 14/449,085

(22) Filed: Jul. 31, 2014

(65) Prior Publication Data

US 2015/0036107 A1    Feb. 5, 2015

(30) Foreign Application Priority Data

Jul. 31, 2013  (JP) .................... 2013-159879
Jul. 7, 2014   (JP) .................... 2014-139708

(51) Int. Cl.
*G03B 21/20*     (2006.01)
*G02B 27/10*     (2006.01)
(Continued)

(52) U.S. Cl.
CPC .......... *G03B 21/204* (2013.01); *G02B 27/102* (2013.01); *G03B 21/208* (2013.01); *G03B 33/08* (2013.01); *H01S 5/02248* (2013.01); (Continued)

(58) Field of Classification Search
CPC .......... F21K 9/56; F21K 99/00; F21V 13/14; F21V 14/08; F21V 8/00; G02B 27/102; G02B 6/0096; G02B 21/20; H01S 5/022; H04N 9/31
See application file for complete search history.

(56) References Cited

U.S. PATENT DOCUMENTS

2003/0128341 A1* 7/2003 Li ................. G02B 27/0994
                                                    353/53
2010/0315598 A1  12/2010 Yamamoto
(Continued)

FOREIGN PATENT DOCUMENTS

JP    2004-341105 A    12/2004
JP    2011-002518 A    1/2011
(Continued)

*Primary Examiner* — Sultan Chowdhury
*Assistant Examiner* — Danell L Owens
(74) *Attorney, Agent, or Firm* — Foley & Lardner LLP

(57) ABSTRACT

Provided is a light source unit that includes: one or more kinds of phosphor; a substrate, on which the one or more kinds of phosphor is applied; a plurality of semiconductor laser elements arrayed at a predetermined interval in a package, wherein each of the semiconductor laser elements emits a laser light beam through a light emission region; and a first optical system that comprises a first lens system, a multiplexing optical member having a light entering surface and a light exiting surface, and a second lens system, wherein the first optical system directs the laser light beams emitted from the respective semiconductor laser elements toward the substrate, the first lens system receives the laser light beams emitted from the respective semiconductor laser elements directly without substantial parallelization of the respective received laser light beams, and condenses the received laser light beams on the light entering surface of the multiplexing optical member, the multiplexing optical member multiplexes the laser light beams condensed by the first lens system, into a multiplexed laser light beam having a spatially-uniform intensity distribution, and the second lens system condenses the multiplexed laser light beam that has exited from the light exiting surface of the multiplexing optical member onto the one or more kinds of phosphor.

20 Claims, 13 Drawing Sheets

(51) Int. Cl.
*H04N 9/31* (2006.01)
*G03B 33/08* (2006.01)
*H01S 5/022* (2006.01)
*H01S 5/40* (2006.01)
*F21V 8/00* (2006.01)
*G02B 26/00* (2006.01)
*H01S 5/00* (2006.01)

(52) U.S. Cl.
CPC .......... *H01S5/4012* (2013.01); *H04N 9/3114* (2013.01); *H04N 9/3158* (2013.01); *H04N 9/3161* (2013.01); *G02B 6/0096* (2013.01); *G02B 26/008* (2013.01); *H01S 5/005* (2013.01); *H01S 5/0071* (2013.01); *H01S 5/02276* (2013.01); *H01S 5/4018* (2013.01); *H01S 5/4025* (2013.01); *H01S 5/4056* (2013.01)

(56) References Cited

U.S. PATENT DOCUMENTS

| | | | |
|---|---|---|---|
| 2010/0328632 A1* | 12/2010 | Kurosaki | G03B 21/204 353/98 |
| 2012/0092624 A1 | 4/2012 | Oiwa et al. | |
| 2013/0088471 A1* | 4/2013 | Kitano | H04N 9/3114 345/208 |

FOREIGN PATENT DOCUMENTS

| | | |
|---|---|---|
| JP | 2011-013313 A | 1/2011 |
| JP | 2011-076781 A | 4/2011 |
| JP | 2011-154930 A | 8/2011 |
| JP | 2011-175000 A | 9/2011 |
| JP | 2011-175077 A | 9/2011 |
| JP | 2011-191466 A | 9/2011 |
| JP | 2012-063488 A | 3/2012 |
| JP | 2012-088451 A | 5/2012 |
| JP | 2013-092752 A | 5/2013 |

\* cited by examiner

LIGHT SOURCE UNIT AND OPTICAL ENGINE

CROSS REFERENCE TO RELATED APPLICATIONS

This application claims the benefit of Japanese Priority Patent Application JP2013-159879 filed on Jul. 31, 2013, and JP2014-139708 filed on Jul. 7, 2014, the entire contents of which are incorporated herein by reference.

BACKGROUND

The disclosure relates to a light source unit and an optical engine. In particular, the invention relates to a light source unit that utilizes emission of light derived from phosphor, and to an optical engine provided with the light source unit.

A discharge-based light source such as an ultrahigh pressure mercury lamp or a xenon lamp has been used for a projector. In recent years, a configuration has been proposed in which light-emitting diodes (LEDs) are used for a light source (for example, see Japanese Unexamined Patent Application Publication No. 2011-2518) or in which a semiconductor laser element is used for a light source (for example, see Japanese Unexamined Patent Application Publication No. 2012-88451), in terms of superiority in decreased power consumption and a reduced environmental burden.

In particular, high expectation is placed, as a high luminance projector that takes safety into consideration, on a hybrid projector in which a semiconductor laser element and a phosphor are combined (for example, see Japanese Unexamined Patent Application Publication Nos. 2011-13313, 2011-76781, 2012-63488, and 2004-341105). For example, a light source unit of a projector disclosed in JP2011-13313A is provided with a blue semiconductor laser element and a rotatable phosphor wheel. The phosphor wheel includes a wheel substrate serving as a circular substrate formed with three regions that are adjacent to one another in a circumferential direction and each having a fan-like shape. The wheel substrate includes: a region in which a phosphor that absorbs blue light and emits green light is arranged; a region in which a phosphor that absorbs the blue light and emits red light is arranged; and a transparent base material region in which a light diffusion layer is arranged instead of a phosphor. The phosphor wheel disclosed therein is thus a so-called reflective phosphor wheel. In the light source unit, the blue light emitted from the blue semiconductor laser element is condensed by a lens to be applied onto the phosphor wheel while the phosphor wheel is in rotation. The blue light thus passes through the phosphor wheel when being applied onto the transparent base material region, and causes the green light or the red light to be emitted and reflected toward the blue semiconductor laser element when being applied onto one of the regions arranged with the respective phosphors. The laser light having passed through the phosphor wheel and the pieces of light having been emitted from the respective phosphors are used as illumination light. Further, those pieces of color light are time-divisionally displayed by a display device located downstream of the light source unit on the basis of image data, thus allowing a color image to be formed on a screen.

Also, a light source unit of a projector disclosed in JP2004-341105A is provided with a blue-violet light excitation light source and a rotatable phosphor wheel, for example. The phosphor wheel includes a wheel substrate serving as a transparent substrate in which a phosphor that emits blue light, a phosphor that emits green light, and a phosphor that emits red light are coated in a circumferential direction on a light exiting side of the transparent substrate to define respective three regions. The phosphor wheel is thus a so-called transmissive phosphor wheel. In the light source unit, blue-violet light is applied onto the phosphor wheel while the phosphor wheel is in rotation, causing the red light, the blue light, and the green light to be emitted on the opposite side of the excitation light source from the respective phosphors.

Incidentally, when utilizing the light emitted from the phosphor for part or all of illumination light, it is necessary to use an excitation light source having a high light intensity in order to achieve higher luminance. Such a high-light-intensity light source unit is achieved by arranging a plurality of semiconductor laser elements.

For example, a light source unit of a projector disclosed in JP2011-76781A is provided with a plurality of blue laser emitters arrayed in matrix, a rotatable phosphor wheel, and a red LED. The phosphor wheel includes a wheel substrate in which a phosphor-arranged region and a transparent base material region are disposed side-by-side in a circumferential direction. The phosphor-arranged region is arranged with a phosphor that emits green light, and the transparent base material region is arranged with no phosphor and includes a light diffusion layer. The phosphor wheel disclosed therein is thus a reflective phosphor wheel. In the light source unit, the blue light emitted from each of the blue laser emitters is caused to be parallel light by a collimator lens before being applied onto the phosphor wheel, while the phosphor wheel is in rotation. Thus, the blue light that passes through the phosphor wheel upon application of the blue laser light onto the transparent base material region, the green light reflected upon application of the blue laser light onto the phosphor-arranged region, and the red light emitted from the LED form illumination light.

Also, for example, a light source unit of a projector disclosed in JP2012-63488A is provided with a plurality of blue light sources each generating blue light that serves both as excitation light and color light, and a transparent substrate that holds a phosphor layer thereon. The plurality of blue light sources are disposed in five-row-five-column matrix pattern on a substrate. The transparent substrate is fixed at a predetermined position, and the phosphor layer is disposed on a light exiting side of the transparent substrate. The phosphor layer produces fluorescence that includes red light and green light from part of the blue light that have entered the transparent substrate, and remaining part of the blue light passes through the phosphor layer, thus forming illumination light.

SUMMARY

Light emitted from a semiconductor laser element is not parallel light but is diverging light whose spread angle in a horizontal direction and that in a vertical direction differ from each other, and thus a laser spot spreads in an elliptical shape. For this reason, when a plurality of semiconductor laser elements are arranged at narrow intervals with the aim of reducing a size of a light source having a high light intensity, emission light derived from one of the semiconductor laser elements may be partially overlapped with emission light derived from adjacent one of the semiconductor laser elements to cause a crosstalk, due to the light emitted from each of the semiconductor laser elements being the diverging light. The occurrence of crosstalk within an optical component such as a lens may result in unexpected change in a direction of the emission light attributable to a factor such as an interference of light, making it difficult to spatially propagate the emission light efficiently.

To address this situation, an optical component such as a collimator lens has been disposed near each of the semiconductor laser elements to cause the diverging light to be the parallel light, when arranging a plurality of semiconductor laser elements in a light source unit (for example, see Japanese Unexamined Patent Application Publication No. 2011-76781). A projector according to a reference example that uses such a light source unit is described below with reference to FIG. 10. It is to be noted that the following discussion of a reference example is intended to be illustrative for easier understanding only and is not be construed as an admission of prior art. FIG. 10 schematically illustrates a configuration of an optical engine 101 directed to a projector according to a reference example. In the configuration, a plurality of semiconductor laser elements 111 are packaged and each include a plurality of lead terminals or connection pins such as anode and cathode. Collimator lenses 112 are disposed on respective optical axes of the respective semiconductor laser elements 111.

In the optical engine 101 configured as illustrated in FIG. 10, the collimator lenses 112 causes light beams emitted from the respective semiconductor laser elements 111 to be respective parallel light beams, and a condenser lens 113 applies the parallel light beams onto a phosphor 120 provided at a phosphor wheel 105. The phosphor wheel 105 is rotated by a motor 109. Fluorescence generated by the phosphor wheel 105 is condensed by a lens system 150, following which the condensed fluorescence is multiplexed by a multiplexing system 160. The multiplexing system 160 is provided with: a multiplexing optical member 161 which may be, for example, a rod integrator, a light pipe, or the like; a lens 162 disposed on a light entering side of the multiplexing optical member 161; and a lens 163 disposed on a light exiting side of the multiplexing optical member 161. Light multiplexed by the multiplexing system 160 is reflected by a reflection mirror 170, following which the reflected light is modulated to form an image by a light modulator 180 which may be, for example, a digital micromirror device (DMD), a liquid crystal device, or the like. The thus-formed image is projected onto an unillustrated screen by a projection lens 190.

In order to dispose the semiconductor laser elements 111 at further narrower intervals in a light source unit 102 according to the reference example, it is necessary to further reduce a size of each of the collimator lenses 112. Also, it is necessary that the collimator lenses 112 be disposed at high precision. Hence, disposing the semiconductor laser elements 111 at further narrower intervals incurs a decrease in assembly efficiency and an increase in costs.

On the other hand, the phosphor 120 of the phosphor wheel 105 deteriorates with increase in intensity of excitation light. Also, with the increase in intensity of the excitation light, the phosphor tends to cause decrease in wavelength conversion efficiency attributable to absorption saturation and thermal quenching caused by high temperature. In a case where the light derived from each of the semiconductor laser elements 111 is multiplexed and the multiplexed light is condensed to be applied onto the phosphor directly, laser light in such a case has a nearly Gauss-function-based light intensity distribution as shown in FIG. 11 in a plane, of the phosphor wheel 105, in which the phosphor 120 is arranged. This consequently decreases the wavelength conversion efficiency in a region around the center of the application of the laser light in the plane in which the phosphor 120 is arranged of the phosphor wheel 105. Also, when such excitation light is condensed and applied onto the phosphor 120 after having been subjected to further increase in intensity thereof, the phosphor 120 may be damaged with failure to maintain its fixation to a substrate of the phosphor wheel 105.

To address these situations, it may be contemplated to suppress an application intensity of the excitation light by widening a size of the application thereof on the phosphor. However, it is desirable that a region in which fluorescence is emitted be narrowed in relation to Etendue, and to that end, it is necessary to condense the laser light derived from the excitation light source as much as possible.

It is desirable to provide a light source unit capable of suppressing deterioration in phosphor and outputting light having high luminance, and an optical engine including the light source unit.

A light source unit according to an embodiment of the invention emits at least fluorescence, and includes: one or more kinds of phosphor; a substrate, on which the one or more kinds of phosphor is applied; a plurality of semiconductor laser elements arrayed at a predetermined interval in a package and each emits a laser light beam through a light emission region; and a first optical system that includes a first lens system, a multiplexing optical member having a light entering surface and a light exiting surface, and a second lens system, in which the first optical system directs the laser light beams emitted from the respective semiconductor laser elements toward the substrate. The first lens system receives the laser light beams emitted from the respective semiconductor laser elements directly without substantial parallelization of the respective received laser light beams, and condenses the received laser light beams on the light entering surface of the multiplexing optical member. The multiplexing optical member multiplexes the laser light beams condensed by the first lens system, into a multiplexed laser light beam having a spatially-uniform intensity distribution. The second lens system condenses the multiplexed laser light beam that has exited from the light exiting surface of the multiplexing optical member onto the one or more kinds of phosphor.

An optical engine according to an embodiment of the invention includes: the light source unit according to any embodiment of the invention; a third lens system that condenses at least the fluorescence in the light emitted from the light source unit; a second multiplexing optical member that multiplexes the light condensed by the third lens system, in which the second multiplexing optical member is one of a rod integrator and a light pipe; a light modulator that modulates the light multiplexed by the second multiplexing optical member; and a projection lens that projects the light modulated by the light modulator.

An optical engine according to another embodiment of the invention includes: the light source unit according to any embodiment of the invention; a fluorescence receiving lens parallelizes the fluorescence emitted by the phosphor; a second optical system directs the laser light beam that has exited from the second lens system; a second multiplexing optical member including a rod integrator or a light pipe that multiplexes the fluorescence passed through the fluorescence receiving lens and the laser light beam passed through the second optical system; a light modulator that modulates the light multiplexed by the second multiplexing optical member; and a projection lens that projects the light modulated by the light modulator.

In the light source unit according to the above-described embodiment of the invention, it is possible to multiplex the light beams derived from the plurality of light sources that are configured by the plurality of semiconductor laser elements each configured to emit a diverging light beam, without increasing the number of components. In addition, because the light intensity distribution is made uniform, it is possible to achieve a wavelength conversion while suppressing deterioration in the phosphor, without involving a decrease in conversion efficiency. Also, according to one embodiment of the invention, it is possible to provide the optical engine that is small in size and high in luminance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the invention.

FIG. 5A is a graph showing a light intensity derived from the light source unit illustrated in FIG. 1, and FIG. 5B is a graph in which a graph in FIG. 11 is shown together in an overlapped fashion.

DETAILED DESCRIPTION

Figure 1:
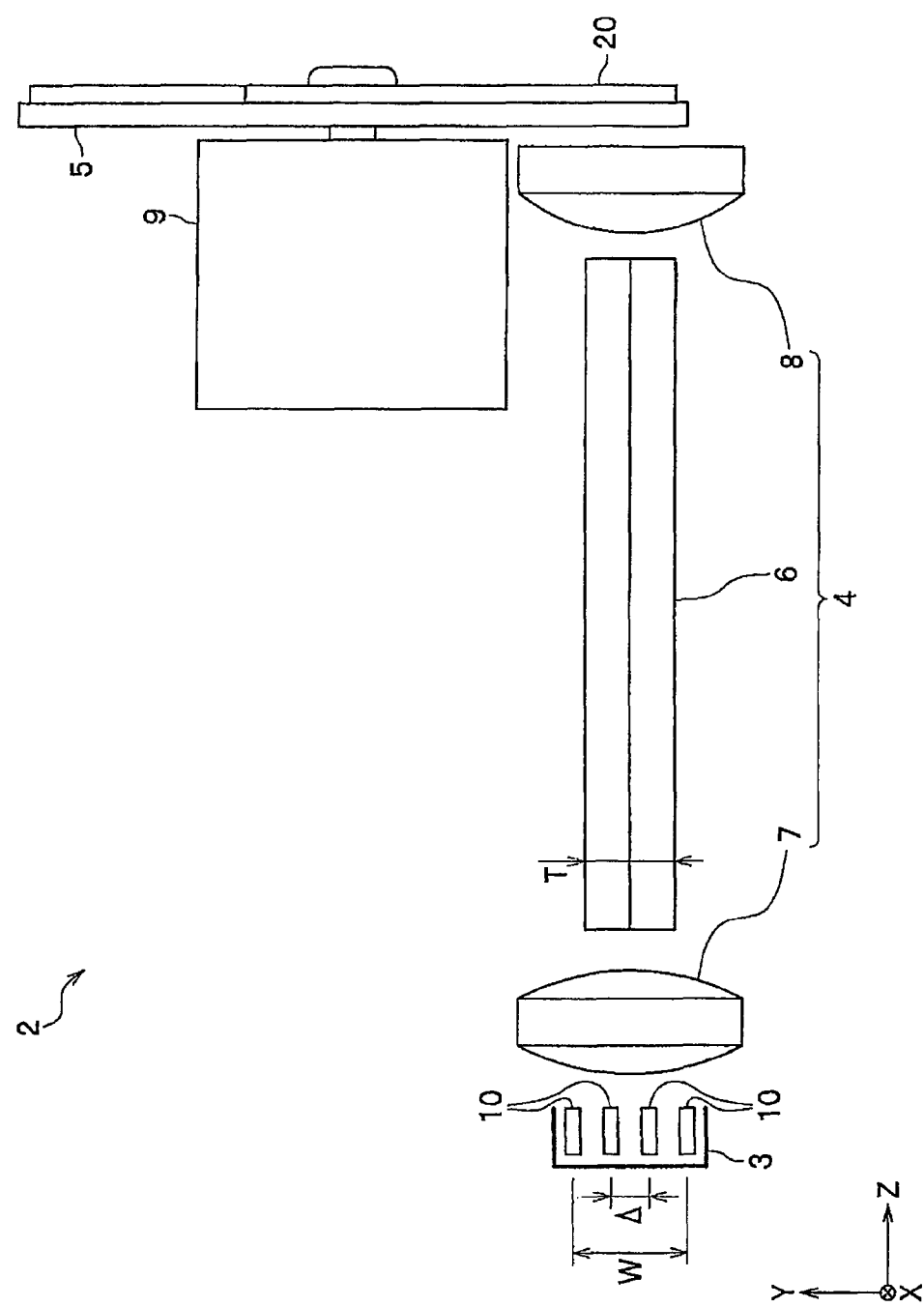
FIG. 1 schematically illustrates a configuration of a light source unit according to a first embodiment of the invention.

A light source unit and an optical engine according to some embodiments of the invention are described in detail below with reference to accompanying drawings that illustrate some non-limiting examples. It is to be noted that each figure may contain exaggeration as to sizes of respective members, a positional relationship thereof, and so forth for clarification of description. Further, wherever possible, the same names and reference numerals are used in the description and the drawings to refer to the same or like elements, and where appropriate, such elements will not be described in detail.

First Embodiment

1. Outline of Light Source Unit

A light source unit 2 illustrated in FIG. 1 is configured to output, as illumination light, laser light derived from semiconductor laser elements 10 and fluorescence emitted by a phosphor excited by the laser light. The light source unit 2 may be incorporated in an optical engine 1 illustrated in FIG. 2, for example. Referring to FIG. 1, the light source unit 2 mainly includes a package 3, an optical system 4, and a substrate 5. The package 3 is provided with the plurality of semiconductor laser elements 10, and the substrate 5 has the phosphor. In the following, the substrate 5 may be referred to as a "phosphor wheel 5" where appropriate.

[Package 3]

The plurality of semiconductor laser elements 10 are arranged in an array pattern inside the package 3 at a predetermined pitch Δ. It is to be noted that, although the semiconductor laser elements 10 are arrayed in a Y-axis direction in FIG. 1, the semiconductor laser elements 10 are also arrayed in an X-axis direction. Also, the package 3 is provided with a plurality of lead terminals or connection pins such as anode and cathode that serve as terminals common to each of the semiconductor laser elements 10.

A material and a shape of a housing or a cover of the package 3 are not particularly limited, and any appropriate housing or any appropriate cover may be used for the package 3. For example, the package 3 may be preferably a metal package in consideration of resistance to factors such as light, heat, and weather. In one embodiment where the metal package is employed, the package 3 may be preferably sealed with gas without using a resin used to seal the semiconductor laser elements 10. Also, the package 3 may preferably have a configuration in which an opening is provided on a light emission region side (on the right side in FIG. 1) of the package 3 and the opening is covered with a member less degraded by light such as inorganic glass. A configuration may be employed for the package 3 in which photodiodes are disposed to monitor the output of the semiconductor laser elements 10. Further, a configuration may be employed for the package 3 in which protection elements such as Zener diodes are disposed to prevent the semiconductor laser elements 10 from element breakdown or performance degradation attributable to application of excessive voltage.

Figure 12:
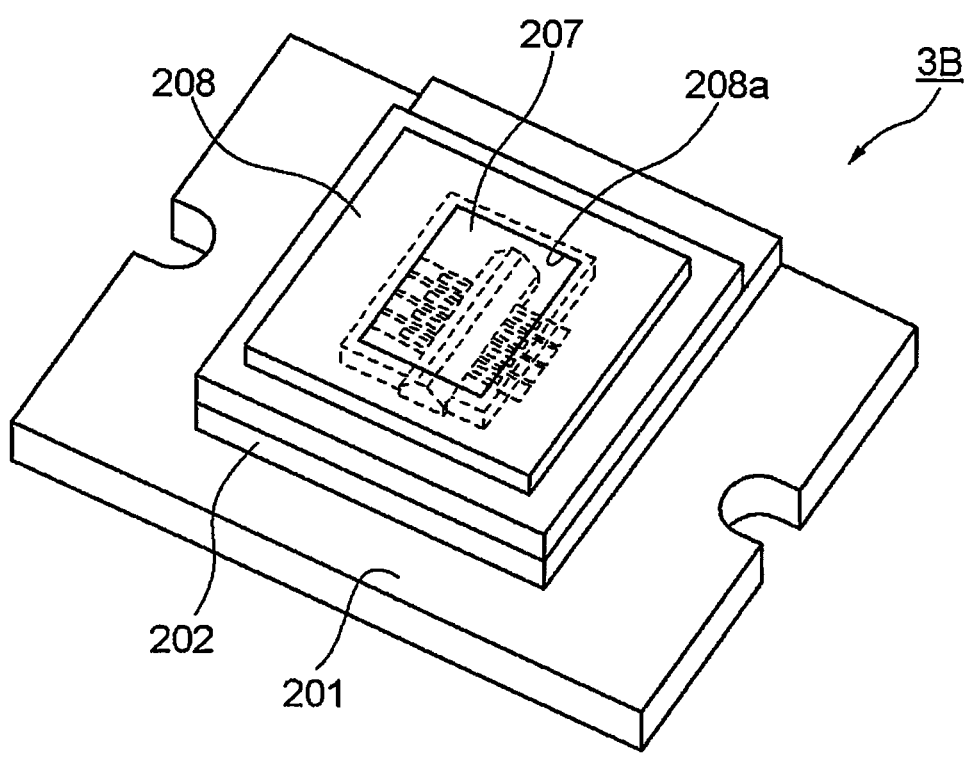
FIG. 12 is a perspective view schematically showing a package which includes a plurality of laser elements according to another embodiment of the invention.
Figure 13:
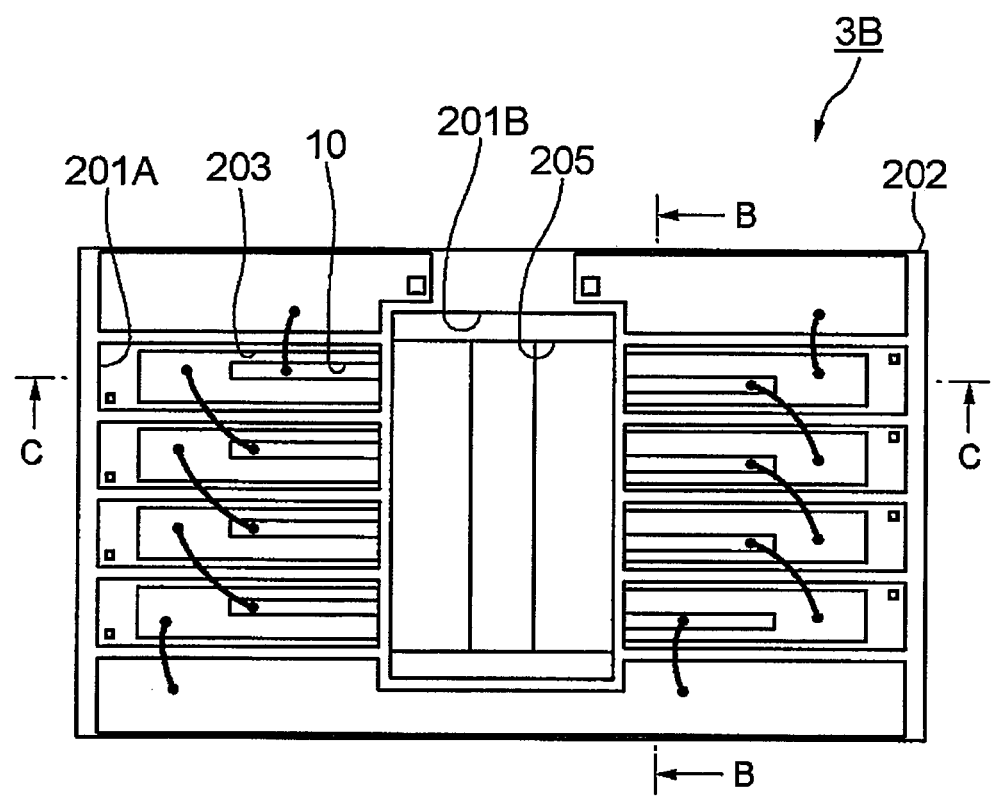
FIG. 13 is a plan view schematically showing a part of the structure shown in FIG. 12, except for the cap.
Figure 14:
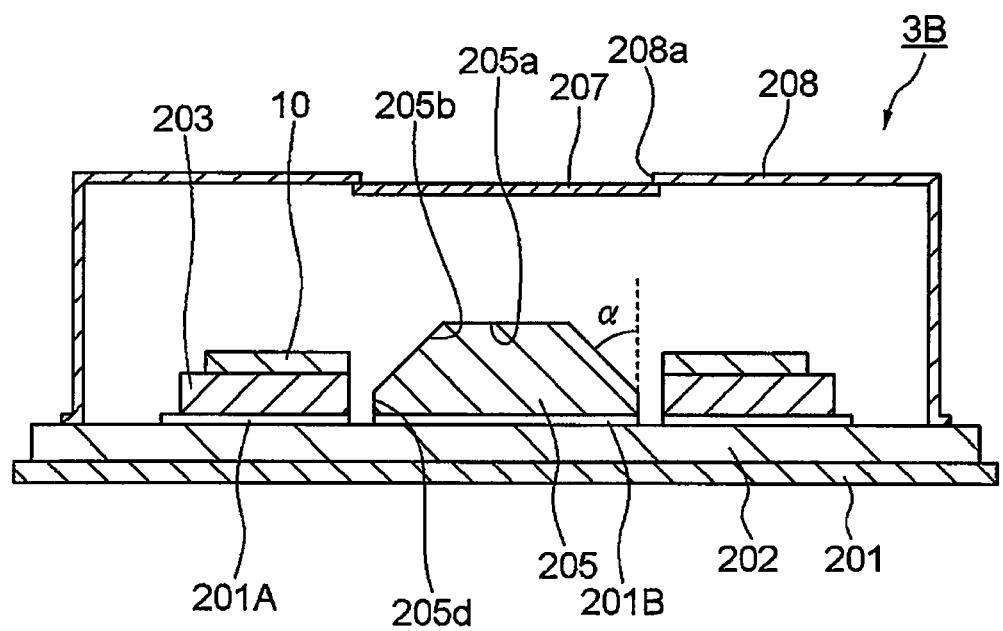
FIG. 14 is a schematic cross-sectional view taken along line C-C of FIG. 13.

Referring to FIGS. 12 to 14, a package 3B which is another example of a package according to a light source according to an embodiment will be described. FIG. 12 is a perspective view schematically showing a package which includes a plurality of laser elements according to another embodiment of the invention. FIG. 13 is a plan view schematically showing a part of the structure shown in FIG. 12, except for the cap 208. FIG. 14 is a schematic cross-sectional view taken along section line C-C of FIG. 13. A plurality of semiconductor laser elements 10 arrayed along section line B-B correspond to a plurality of semiconductor laser elements 10 arrayed along section line B-B illustrated the configurations of FIGS. 1, 2, and 6 to 9. The package 3B includes a first base material 201, a second base material 202 arranged on the first base material 201, a first metal layer 201A and a second metal layer 201B disposed spaced apart from each other on the second base material 202, a submount 203 arranged on the first metal layer 201A, the plurality of semiconductor laser elements 10 disposed on the submount 203, and a reflection member 205 configured to reflect laser light emitted from the semiconductor laser elements 10.

The semiconductor laser elements 10 are disposed on the submount 203. Accordingly, heat generated from the semiconductor laser elements 10 can be released efficiently to the first base material 201 through the submount 203 etc.

In FIG. 13, the plurality of semiconductor laser elements 10 are mounted interposing the reflection member 205, but the semiconductor laser elements 10 may be arranged with respect to only one side of the reflection member 205, or may be arranged surrounding the entire periphery of the reflection member 205. FIG. 14 is a schematic cross-sectional view taken along section line C-C of FIG. 13. The package 3B can also be employed as the packages 3 shown in the figures respectively illustrating the light source or optical engines of other embodiments.

Hereinafter, each constituting components will be described. The first base material 201 is a base material arranged at a lower surface of the package 3B in view of heat dissipation, and examples of the material thereof include Cu and Al. The second base material 202 is a base material configured to mount the submount 203, the reflection member 205 or the like, via the first metal layer 201A or the second metal layer 201B, and examples of the material thereof include AlN, SiC, SiN, and alumina. The second base material 202 can be used optionally. Examples of the submount 203 include MN, CuW, diamond, SiC, and ceramics. The thickness of the submount is not specifically limited, and about 100 to about 500 μm may be employed, where about 120 to about 400 μm is preferable and about 150 to about 300 μm is more preferable. Employing the submount 203 having a thickness greater than a certain thickness allows the light from the semiconductor laser elements by the reflection member to be reflected efficiently and to be exited out. The planar shape of the submount 203 is not specifically limited, and for example, a polygonal shape such as a rectangular shape, a circular shape, an oval shape or a shape similar to those can be employed.

The reflection member 205 is preferably arranged so that the reflection surface of the reflection member 205 is inclined (see a in FIG. 14) with respect to the end part 205d at the side of the semiconductor laser element from which the laser light to be emitted. The laser light is reflected by such a reflection surface, so that the direction of the optical axis of the laser light emitted from the respective semiconductor laser elements 10 can be changed. As shown in the figures, in the case where the laser light is emitted from the semiconductor laser element 10 in a direction substantially in parallel to the main plane of the substrate 101, an angle between the main plane of the first material 201 and the inclined surface 105b may be set to 45±5 degrees, preferably to 45±1 degrees, which allows for emission of the light from the semiconductor laser element 10 in a substantially perpendicular direction with respect to the first base material 201 to guide the light into the optical system 4 (first lens system 7). The reflecting member 205 may also have, at an opposite side (a side proximate to the side where the laser light is emitted from the package) from the mounting side, a flat surface 205a which is substantially in parallel to the main plane of the substrate 201. With this arrangement, the reflection member can be mounted on the first substrate with good accuracy and firmly. Examples of the material of the reflection member 205 include glass (quartz glass, synthetic quartz glass, etc.), sapphire, ceramics, or a metal, and a member provided with a reflection film formed on a eutectic material.

The package 3B is sealed with the cap 208 attached to the second base material 202 which is arranged on the first base material 201 so as to cover the semiconductor laser elements 10 and the reflection member 205. With this arrangement, air-tightness in the package can be enhanced and also the waterproof and dustproof performances can be enhanced. The cap 208 defines an opening 208 in a surface thereof, and a light transmissive member 207 is arranged at the opening 208a. The light transmissive member 207 may be made of a material which allows laser light to pass therethrough. For example, glass (borosilicate glass, quarts glass, synthetic quartz glass etc.), sapphire, light transmissive ceramics, or the like, can be employed. Further, in order to monitor the optical output of the semiconductor laser elements 10, a photodiode may be arranged on the first base material 201.

Each of the semiconductor laser elements 10 may be configured to emit light that has any wavelength depending on the intended use. In one embodiment where each of the semiconductor laser elements 10 is a light-emitting element configured to emit blue light (light having a wavelength in a range from about 430 nm to about 490 nm), a semiconductor such as a nitride-based semiconductor may be used. For example, the nitride-based semiconductor may be that defined by $In_XAl_YGa_{1-X-Y}N$ where $0 \leq X \leq 1$, $0 \leq Y \leq 1$, and $X+Y \leq 1$. Alternatively, a nitride-based semiconductor may be used in which part of the nitride-based semiconductor is substituted by B serving as a group III element, or in which N is partially substituted by P or As serving as a group V element. In the following, description is given with reference to a non-limiting example where each of the semiconductor laser elements 10 emits blue light.

[Optical System 4]

The optical system 4 includes a multiplexing optical member 6, a first lens system 7, and a second lens system 8. The optical system 4 is configured to apply laser light beams emitted from the respective semiconductor laser elements 10 to the phosphor wheel 5. The optical system 4 includes the first lens system 7, the multiplexing optical member 6, and the second lens system 8 in this order on an optical axis that is along a Z-axis, in order to condense the laser light beams derived from the package 3 on the phosphor wheel 5.

The multiplexing optical member 6 is configured to multiplex the laser light beams that have emitted from the respective semiconductor laser elements 10 inside the package 3, into a multiplexed laser light beam having a spatially-uniform intensity distribution. In the first embodiment, the multiplexing optical member 6 may be a rod integrator or a light pipe.

The rod integrator is made of a light-transmissive material, and utilizes total reflection occurring at side surfaces thereof. Examples of the light-transmissive material may include a glass and a resin material. The glass may be vitreous silica, synthetic fused silica, BK7 glass, or other suitable glass, and the resin material may be polycarbonate, an acrylic resin, or other suitable resin material. The light pipe is hollow and has mirrored side surfaces. Commercially-available small-sized rod integrators and light pipes each may have a length in a range from about few millimeters to about tens of millimeters and a diameter in a range from about few millimeters to about ten-odd millimeters. It is preferable that a size of the multiplexing optical member 6 be as small as possible in order to achieve reduction in size of the light source unit 2.

For example, a single convex lens may be used to multiplex the laser light beams emitted from the respective semiconductor laser elements 10. Alternatively, a fly-eye lens may be used to cause the intensity distribution of the entering light to be spatially uniform, for example. Hence, in one embodiment, the multiplexing optical member 6 may have a combination of the convex lens and the fly-eye lens, for example. On the other hand, the rod integrator or the light pipe combines the functions of multiplexing the laser light beams emitted from the respective semiconductor laser elements 10 and causing the intensity distribution of the multiplexed laser light beam to be spatially uniform. Hence, one embodiment where the rod integrator or the light pipe is used makes it possible to reduce the number of components in comparison to the embodiment where the combination of the convex lens and the fly-eye lens is used.

In the first embodiment, the multiplexing optical member 6 may be the rod integrator, and may have a polygon shape in which a shape of a light entering surface and a shape of a light exiting surface of the multiplexing optical member 6 are the same as one another, for example. The shape of the light entering surface of the multiplexing optical member 6 may preferably be any one of shapes selected from the group consisting of tetragon, pentagon, and hexagon. This makes it easier for the multiplexing optical member 6 to cause the intensity distribution of the light to be spatially uniform. In the following, description is given with reference to a non-limiting example where the shapes of the light entering surface and the light exiting surface of the multiplexing optical member 6 are both hexagon. In such an embodiment, a shape of the multiplexing optical member 6 as a whole is a hexagonal column. It is to be noted that FIG. 1 illustrates one embodiment where the multiplexing optical member 6 has a shape of polygonal column having a uniform thickness; however, the multiplexing optical member 6 may have a shape of polygonal pyramid so tapered as to have a larger thickness in a light entering side than in a light exiting side thereof.

The first lens system 7 is configured to receive the laser light beams emitted from the respective semiconductor laser elements 10 in the package 3 directly without substantial parallelization of the received laser light beams, and allow the received laser light beams to be condensed on the light entering surface of the multiplexing optical member 6. Although FIG. 1 illustrates one embodiment where the first lens system 7 includes a single lens, the first lens system 7 may include two or more lenses that are disposed on an optical axis.

The second lens system 8 is configured to allow the multiplexed laser light beam that has exited from the light exiting surface of the multiplexing optical member 6 to be condensed on one or more kinds of phosphor 20 of the substrate 5. The light that has exited from the multiplexing optical member 6 has a uniform light intensity and is spread to some extent rather than being parallel light. Although FIG. 1 illustrates one embodiment where the second lens system 8 includes a single lens, the second lens system 8 may include two or more lenses that are disposed on an optical axis.

[Substrate 5 Having Phosphor (Phosphor Wheel) 5]

The substrate 5 having the phosphor (the phosphor wheel) 5 may be a wheel-shaped substrate provided with the phosphor 20. The phosphor wheel 5 may be driven and rotated by a motor 9. When the one or more kinds of phosphor 20 is located in a region, of the phosphor wheel 5, under application of the multiplexed laser light beam that has exited from the second lens system 8, that phosphor 20 in the phosphor wheel 5 may emit the fluorescence.

Figure 3A:
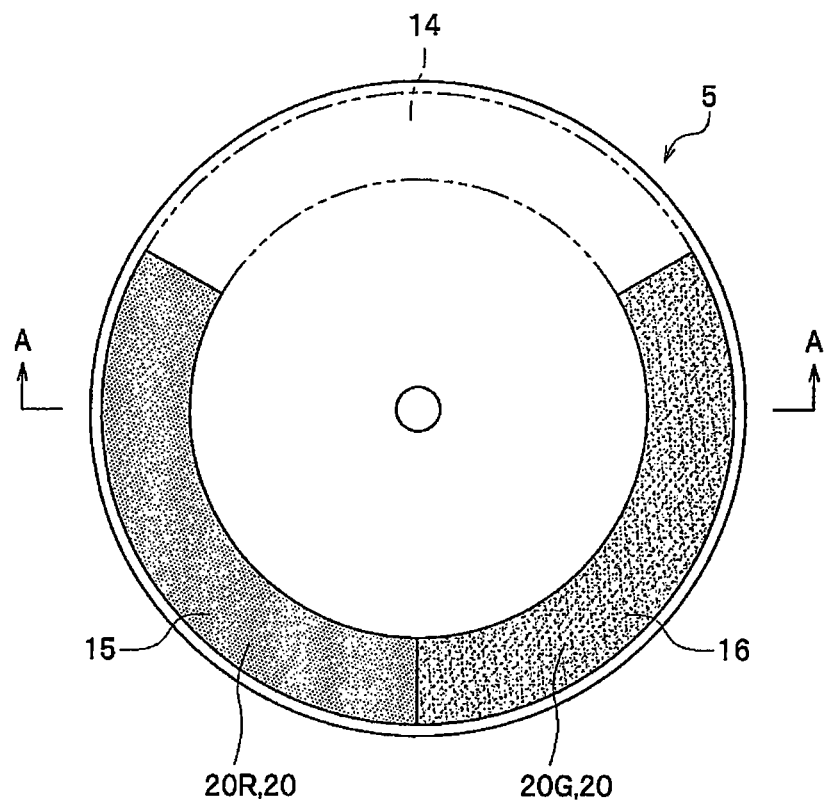
FIG. 3A is a plan view illustrating an example of a substrate having a phosphor illustrated in FIG. 1.
Figure 3B:
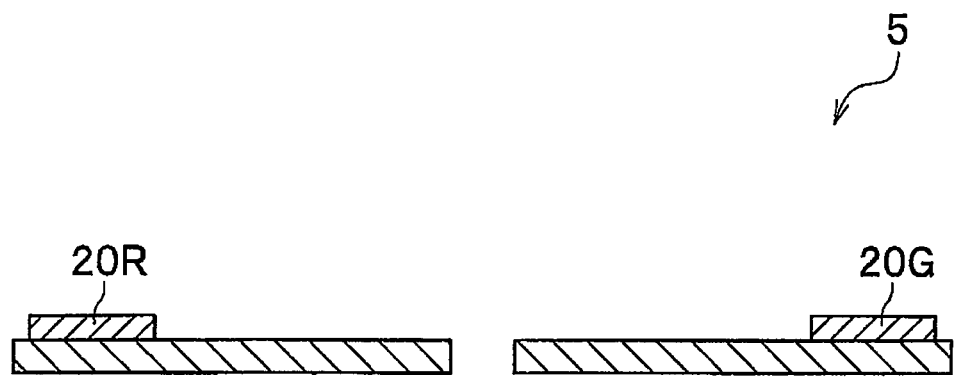
FIG. 3B is a cross-sectional view of end faces taken along line A-A in FIG. 3A.

FIG. 3A illustrates an example of the wheel-shaped substrate 5. The wheel-shaped substrate 5 illustrated in FIG. 3A may be circular in shape. FIG. 3B illustrates a cross section of end faces taken along the line A-A in FIG. 3A. The substrate 5 may be a light-transmissive substrate having a circular shape, for example. The phosphor 20 may be coated on the substrate 5. Alternatively, the phosphor 20 may be embedded in the substrate 5.

The substrate 5 illustrated in FIG. 3A may include an annular region. The annular region may be partitioned into three regions 14, 15, and 16 in a circumferential direction, for example. The region 14 may be a transmission region that allows the blue light emitted from the semiconductor laser elements 10 to pass therethrough, and may be arranged without the phosphor 20. The region 15 may be a phosphor region arranged with a red phosphor 20R that absorbs the blue light emitted from the semiconductor laser elements 10 and emits red light. The region 16 may be a phosphor region arranged with a green phosphor 20G that absorbs the blue light emitted from the semiconductor laser elements 10 and emits green light.

The phosphor 20 absorbs part or all of the light emitted from the semiconductor laser elements 10, and converts such emission light into light having a wavelength different from a wavelength of the emission light. Examples of the green phosphor 20G may include chlorosilicate and $BaSiO_4$:$Eu^{2+}$. Examples of the red phosphor 20R may include CASN-based phosphor and $SrAlSiN_3$:Eu. The CASN-based phosphor may be $(Sr, Ca)AlSiN_3$:Eu or $CaAlSiN_3$:Eu, for example.

It is to be noted that a configuration of the phosphor wheel 5 is not particularly limited. The light source unit 2 is capable of emitting various types of illumination light including fluorescence having at least one kind of color. In the phosphor wheel 5 illustrated in FIG. 3A, the substrate 5 may be partitioned in the circumferential direction to include the regions 15 and 16 each arranged with the phosphor 20, and the region 14 arranged without the phosphor 20. This makes it possible for the light source unit 2 to emit the laser light derived from the package 3 and the fluorescence emitted by the phosphor 20 in a time-sequential manner.

The phosphor wheel 5 illustrated in FIG. 3A is the transmissive phosphor wheel that emits the fluorescence in a direction same as a direction of the laser light emitted from the semiconductor laser elements 10 in the package 3. Alternatively, in one embodiment, the phosphor wheel 5 may be a reflective phosphor wheel that emits the fluorescence in a direction different from the direction of the multiplexed laser light beam that has exited from the second lens system 8.

Although the foregoing description has been given with reference to a non-limiting example where the laser light emitted from the semiconductor laser elements 10 is used for illumination and serves as excitation light that excites the phosphor 20, a configuration may be employed in which the laser light is not used for illumination. In such an alternative embodiment, the region 14 in the phosphor wheel 5 illustrated in FIG. 3A may also be provided with the phosphor 20, and the annular region formed by the regions 14, 15, and 16 of the wheel substrate 5 includes the phosphors 20 that are arranged in a circumferential direction and whose number of kinds corresponds to the number of such regions provided in the phosphor wheel 5. The region 14 may be arranged with a blue phosphor that absorbs light such as the blue light or ultraviolet light emitted by the semiconductor laser elements 10, and emits blue light having a wavelength different from a wavelength of the absorbed light. In such an embodiment, it is possible for the light source unit 2 to release different colors of fluorescence in a time-sequential manner. Examples of the blue phosphor may include BAM: Eu, $Sr_5(PO_4)_3Cl$:Eu, ZnS:Ag, and $(Sr, Ca, Ba, Mg)_{10}(PO_4)_6Cl$:Eu.

Alternatively, without using the red phosphor 20R in the region 15, the green phosphor 20G in the region 16, or both, a phosphor that emits light in a wavelength range other than a wavelength range of the light emitted by any of those phosphors may be used in the phosphor wheel 5 illustrated in FIG. 3A depending on the intended use. For example, a yellow phosphor that absorbs blue light and emits yellow light may be used instead of the green phosphor 20G, for example. For example, the yellow phosphor may be a YAG-based phosphor in which yttrium, aluminum, and garnet are mixed.

The number of partitions for the annular region in the substrate of the phosphor wheel 5 is not limited to three, and may be four or more, or two. Alternatively, the annular region may be a single region. It is sufficient for the phosphor wheel 5 to have at least one kind of phosphor 20. In the foregoing description, the substrate of the phosphor wheel 5 is a circular substrate; however, this is non-limiting and a substrate having a polygon shape such as hexagon or octagon may be used. Also, the substrate 5 is a light-transmissive substrate in the foregoing description, although the substrate 5 is not limited thereto.

Figure 4A:
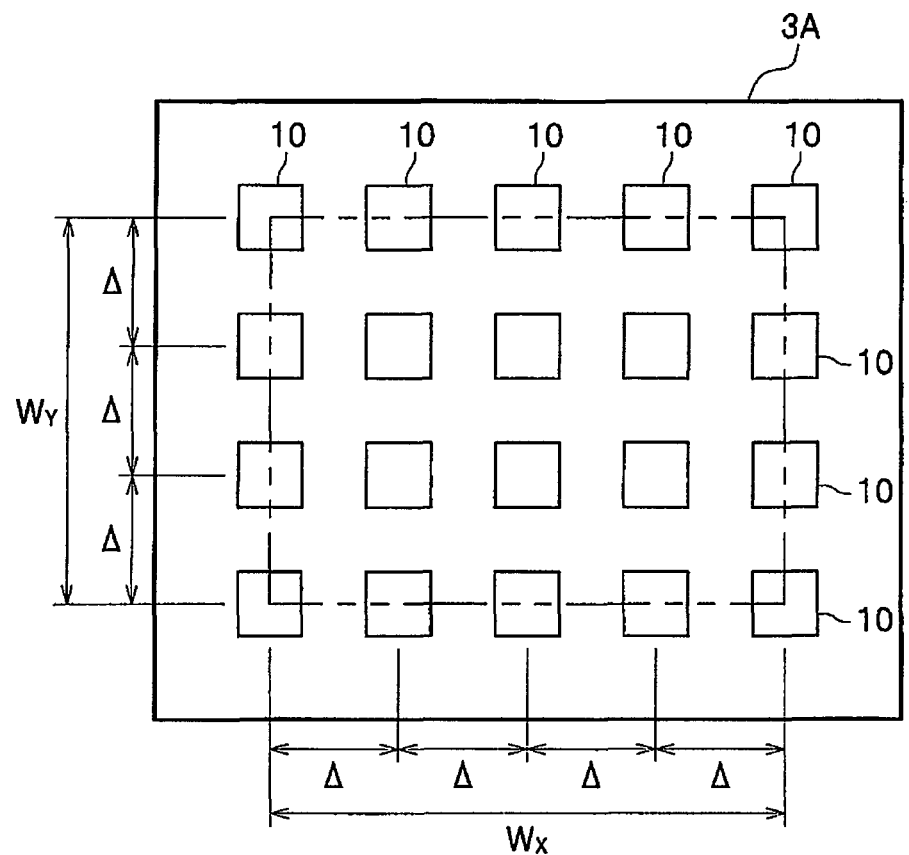
FIG. 4A is a plan view illustrating an example of a package illustrated in FIG. 1.
Figure 4B:
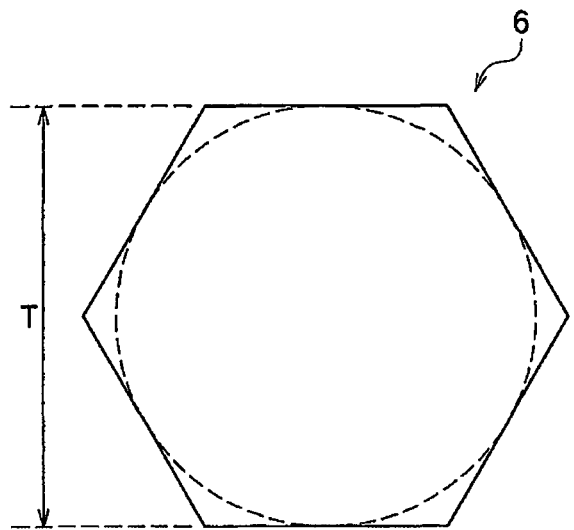
FIG. 4B illustrates an example of a shape of a light entering surface of a multiplexing optical member illustrated in FIG. 1A.

2. Design Example of Sizes of Light Emission Region in Package and Multiplexing Optical Member FIG. 4A is a plan view illustrating an example of a light emission region in the package. FIG. 4B illustrates an example of a shape of the light entering surface of the multiplexing optical member 6. In the package 3A illustrated in FIG. 4A, "Δ" denotes an interval (the pitch Δ) between the semiconductor laser elements 10. For example, a total of twenty semiconductor laser elements 10 may be arranged at the pitch Δ in which five semiconductor laser elements 10 and four semiconductor laser elements 10 may be arrayed in an X (horizontal) direction and in a Y (vertical) direction, respectively, in a lattice form. The pitches Δ each may be about few millimeters.

In one example illustrated in FIG. 4A, a size of the light emission region as a whole of the package 3A may be defined as follows. The shape of the light emission region as a whole of the package 3A is referred to as a "surface shape of the light emission region in the package 3A". The "surface shape of the light emission region in the package 3A" is defined as a graphic shape formed by the trajectory that connects emitting points of all of the semiconductor laser elements 10 that form an outer edge of the light emission region of the package 3A in plan view. When the graphic shape is a rectangle as denoted by a two-dot chain line in FIG. 4A, a length $W_Y$ of the short side of the rectangle is defined as the minimum diameter of the light emission region, and a length $W_X$ of the long side of the rectangle is defined as the maximum diameter of the light emission region. In the example illustrated in FIG. 4A, the length $W_X$ may be equal to 4Δ and the length $W_Y$ may be equal to 3Δ. As used herein, the wording "all of the semiconductor laser elements 10 that form an outer edge" refers to the plurality of semiconductor laser elements 10, i.e., two or more semiconductor laser elements 10, that are so arrayed as to form two or more lines for the X (horizontal) direction, the Y (vertical) direction, or both, or that are arrayed in a concentric pattern. Also, the wording "plurality of semiconductor laser elements 10" refers to all of the semiconductor laser elements that are directed to causing the laser light beams to enter the first lens system 7, and does not encompass other semiconductor laser elements that are incorporated in the light source unit for any other purpose.

The light entering surface of the multiplexing optical member 6 may have a shape of a hexagon in an example illustrated in FIG. 4B. A minimum diameter T of the light entering surface of the multiplexing optical member 6 is defined as a diameter of an inscribed circle of the polygon corresponding to the shape of the light entering surface. It is to be noted that, when the light entering surface of the multiplexing optical member 6 has a shape of a polygon that has an even number of angles, the minimum diameter T is defined as equivalent to a distance between the opposite sides of the polygon.

In the first embodiment, the minimum diameter T of the light entering surface of the multiplexing optical member 6 may be larger than the pitch Δ of the semiconductor laser elements 10 but smaller than the maximum diameter $W_X$ of the surface shape of the light emission region in the package 3A ($Δ<T<W_X$). In other words, when assuming that an image of the light entering surface of the multiplexing optical member 6 is projected onto the array of semiconductor laser elements 10, the image is larger than the pitch Δ of the semiconductor laser elements 10 but smaller than the surface shape of the light emission region in the package 3A. This makes it possible to reduce a size of the multiplexing optical member 6, and thus to reduce a size of the light source unit 2. It is to be noted that the minimum diameter T may be preferably smaller than both the minimum diameter $W_Y$ and the maximum diameter $W_X$ within a range larger than the pitch Δ.

Also, in the first embodiment, the first lens system 7 may include a single lens that may have a diameter larger than the maximum diameter $W_X$ of the surface shape of the light emission region in the package 3A. This makes it possible to provide the first lens system 7 closer to the package 3A.

Figure 10:
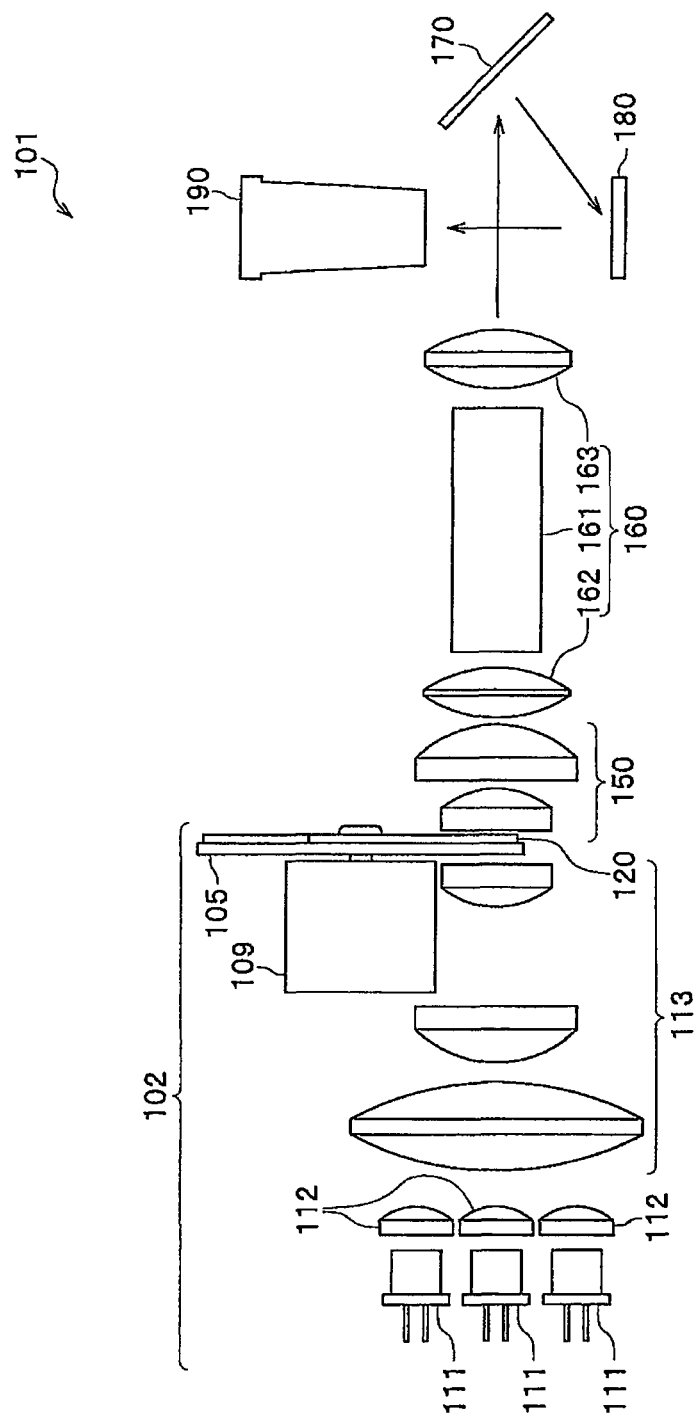
FIG. 10 schematically illustrates an optical engine according to a reference example.
Figure 11:
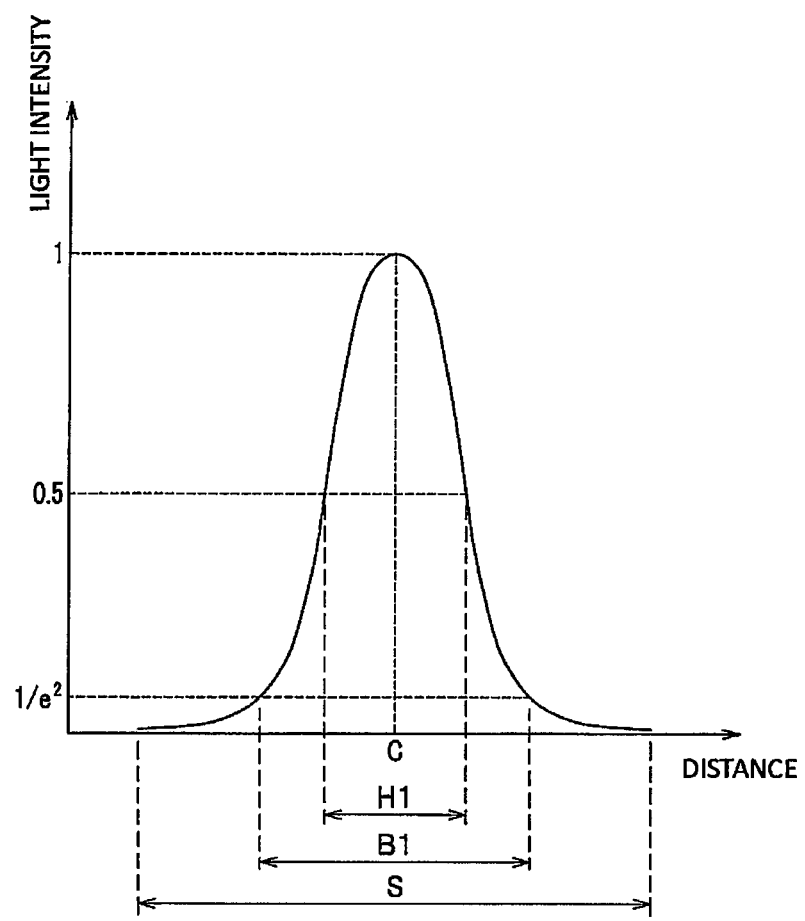
FIG. 11 is a graph showing a light intensity distribution of laser light in a plane in which a phosphor is arranged in the optical engine illustrated in FIG. 10.

3. Example of Light Intensity Distribution of Laser Light Emitted from Semiconductor Laser Elements Description is now given of a light intensity distribution of the laser light emitted from the semiconductor laser elements with reference to a comparison between the light source unit 2 according to the first embodiment illustrated in FIG. 1 and a light source unit 102 illustrated in FIG. 10 according to a reference example. FIG. 11 shows a light intensity distribution of laser light that excites a phosphor 120 in the light source unit 102 illustrated in FIG. 10. Referring to FIG. 11, a horizontal axis in the graph shows a distance along a plane in which the phosphor 120 of a phosphor wheel 105 is arranged. In the graph, "S" denotes a size of laser application onto the phosphor wheel 105, and "C" denotes the center of the laser light. A vertical axis in the graph shows a light intensity of the laser light having been emitted from semiconductor laser elements 111 and subjected to multiplexing. A light intensity in the center of the laser light (the center intensity) is normalized to one. As shown in FIG. 11, the laser light in the case of the light source unit 102 has a nearly Gauss-function-based light intensity distribution whose light intensity is concentrated at the center of the laser light, and thus the light intensity is high in a region around the center of the laser light. This leads to destruction of the phosphor 120 or a decrease in wavelength conversion efficiency. Also, a surrounding region other than the region around the center of the laser light is low in light intensity and an amount of light subjected to the wavelength conversion is small accordingly. A half width of such a light intensity distribution is denoted as "H1", and a distribution width defined by an intensity expressed by $1/e^2$ of an intensity at the center of the light intensity distribution is denoted as "B1" where e is the base of the natural logarithm.

Figure 5A:
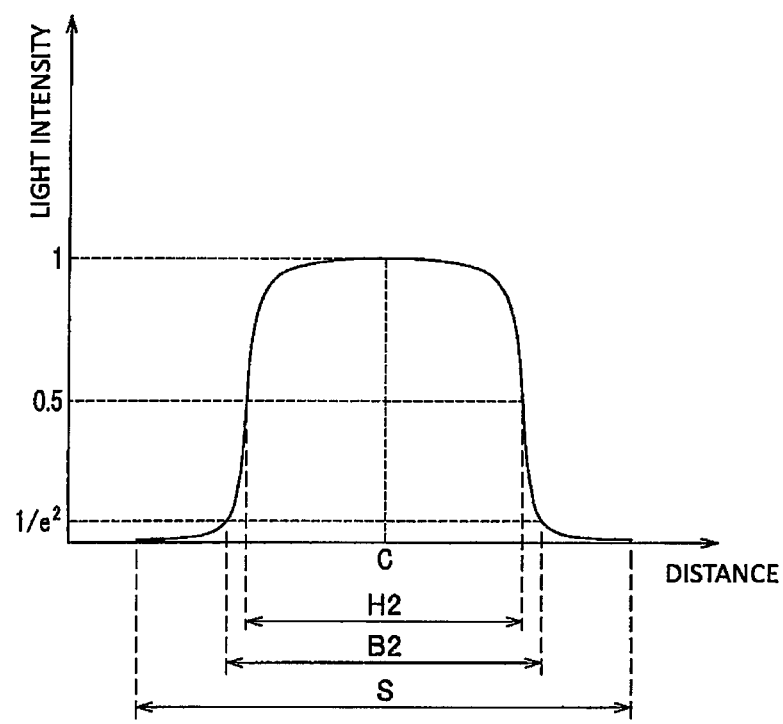
FIGS. 5A and 5B axe each a graph showing a light intensity distribution of laser light in a plane in which the phosphor is arranged.

FIG. 5A shows a light intensity distribution of the laser light that excites the phosphor 20 in the light source unit 2 illustrated in FIG. 1. Referring to FIG. 5A, a horizontal axis in the graph shows a distance along a plane in which the phosphor 20 of the phosphor wheel 5 is arranged. The wording "plane in which the phosphor 20 is arranged" refers to a plane that is parallel to the X-Y plane in FIG. 1. A vertical axis in the graph shows a light intensity of the laser light having been emitted from the semiconductor laser elements 10 in the package 3 and subjected to the multiplexing. "S" in the graph denotes a size of laser application onto the phosphor wheel 5, and a light intensity in the center of the laser light (the center intensity) is normalized to one. As shown in FIG. 5A, the light intensity distribution is spatially uniform in the case of the light source unit 2 and resembles a top-hat-like light intensity distribution. A half width of such a light intensity distribution is denoted as "H2", and a distribution width defined by an intensity expressed by $1/e^2$ of an intensity at the center of the light intensity distribution is denoted as "B2". For example, the wording "the light intensity distribution is spatially uniform" may refer to a situation where the half width H2 is 80 percent or greater of the distribution width B2.

Figure 5B:
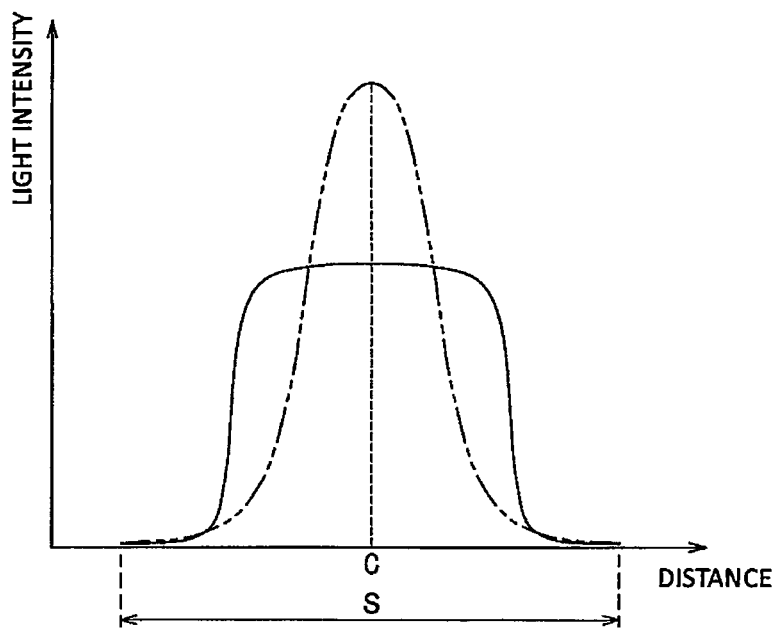

In FIG. 5B, a solid line denotes the light intensity distribution shown in FIG. 5A, and a two-dot chain line denotes the light intensity distribution shown in FIG. 11. FIG. 5B shows those light intensity distributions in an overlapped fashion with positions of the respective laser application regions S being aligned with respect to each other. As shown in FIG. 5B, the light intensity is spatially uniform in the case of the light source unit 2 (denoted by the solid line), i.e., the decrease in the wavelength conversion efficiency in the region around the center of the laser light is suppressed. Hence, it is possible for the light source unit 2 to suppress the intensity in the region around the center of the laser light emitted from the semiconductor laser elements 10 in the package 3 and to prevent deterioration in the phosphor, without enlarging the laser application size S. Also, the light intensity is high in the surrounding region other than the region around the center of the laser light and the amount of light subjected to the wavelength conversion is large accordingly, i.e., it is possible for the light source unit 2 to allow larger amount of excitation light to be subjected to the wavelength conversion.

Next, description is given with reference to FIG. 1 of an operation of the light source unit 2 having the foregoing configuration. The plurality of semiconductor laser elements 10 in the package 3 emit the laser light beams. The first lens system 7 receives, with the single lens, the laser light beams emitted from the respective semiconductor laser elements 10 in the package 3, as they are as the diverging light without substantial parallelization of the received laser light beams, and allows the laser light beams, received in the form of the diverging light as they are, to be condensed on the light entering surface of the multiplexing optical member 6. Here, collimator lenses are not arranged on respective optical axes of the semiconductor laser elements 10, making it possible to provide the first lens system 7 closer to the semiconductor laser elements 10. Hence, because the first lens system 7 is allowed to be brought closer to the semiconductor laser elements 10, it is possible to reduce a size of the light source unit 2.

The multiplexing optical member 6 multiplexes the laser light beams emitted from the respective semiconductor laser elements 10 in the package 3. Hence, it is possible to achieve the light source unit that is high in intensity. Also, the laser light beams emitted from the package 3, each being emitted as diverging light, are multiplexed by the multiplexing optical member 6 into the multiplexed laser light beam having the spatially-uniform intensity distribution as illustrated in FIG. 5A. In other words, the light that has exited from the multiplexing optical member 6 is converted to have the top-hat-like light intensity distribution. The laser light having been made uniform is condensed by the second lens system 8. The laser light having been condensed by the second lens system 8 passes through the substrate of the phosphor wheel 5 to be applied onto the phosphor 20.

In the light source unit 2 according to the first embodiment, it is possible to achieve the light source that is high in light intensity, while achieving the optical systems that are each small in size and small in number of components. Also, the light intensity distribution of the laser light emitted from the semiconductor laser elements 10 is made spatially uniform, and the laser light having been made spatially uniform is applied onto the phosphor 20. Thus, it is possible to excite the phosphor 20 without damaging the phosphor 20, while suppressing the decrease in wavelength conversion efficiency. Hence, it is possible to suppress the deterioration in the phosphor 20 of the phosphor wheel 5.

4. Optical Engine

Figure 2:
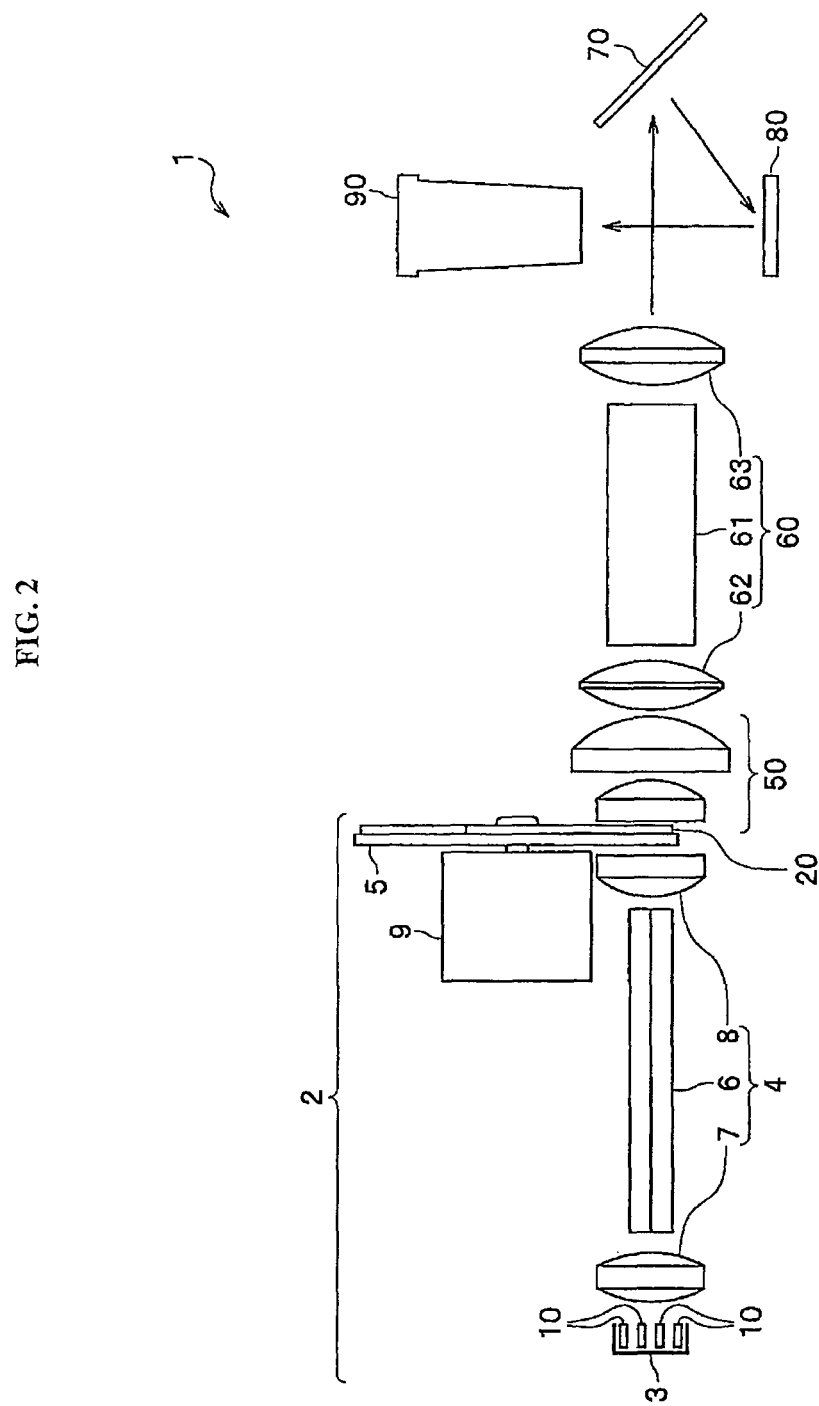
FIG. 2 schematically illustrates a configuration of an optical engine according to one embodiment of the invention.

Description is now given with reference to FIG. 2 of the optical engine 1 that incorporates therein the light source unit 2. The optical engine 1 may include the light source unit 2, a third lens system 50, a second multiplexing system 60, a reflection mirror 70, a light modulator 80, and a projection lens 90. For example, components such as a protective mechanism, a cooling mechanism, and a circuit substrate may be provided in addition to the optical engine 1 to configure a projector. The protective mechanism may be a housing or a cover of the projector, and a circuit substrate may be that used for electrical wiring. In one embodiment where the optical engine 1 is used for a projector, the "optical engine 1" in such a case refers to optical assembly components from the light source unit 2 to the projection lens 90 of the projector.

The third lens system 50 is configured to condense the light (the fluorescence, the laser light, or both) emitted from the light source unit 2. An optical axis of the third lens system 50 corresponds to an optical axis of the second lens system 8 in the light source unit 2. Although FIG. 2 illustrates one embodiment where the third lens system 50 includes two lenses, the third lens system 50 may include three or more lenses that are disposed on an optical axis, or may include a single lens.

The second multiplexing system 60 may include a second multiplexing optical member 61 and lenses 62 and 63. The second multiplexing optical member 61 is configured to multiplex the light condensed by the third lens system 50, and may be a rod integrator or a light pipe, for example. The lens 62 is disposed on a light entering side of the second multiplexing optical member 61, and configured to allow the light condensed by the third lens system 50 to be condensed so as to be applied to a light entering surface of the second multiplexing optical member 61. The lens 63 is disposed on a light exiting side of the second multiplexing optical member 61, and configured to allow the light multiplexed by the second multiplexing optical member 61 to be condensed so as to be applied to the reflection mirror 70. The reflection mirror 70 is so disposed on an optical axis of the second multiplexing system 60 at a predetermined angle as to allow a direction of the light multiplexed by the second multiplexing optical member 61 to be changed and thus to allow that light to be exited therefrom toward the light modulator 80.

The light modulator 80 is configured to modulate the light multiplexed by the second multiplexing optical member 61. The light modulator 80 may be, for example, a digital micromirror device (DMD), a liquid crystal device, or the like. The projection lens 90 is configured to project the light modulated by the light modulator 80 onto an unillustrated screen. The projection lens 90 may be provided with a plurality of lenses that are arranged along an optical axis, for example.

The optical engine 1 may operate as follows. The fluorescence and the laser light that have exited from the light source unit 2 spatially propagate through the third lens system 50 to be multiplexed in the second multiplexing system 60. The light having been multiplexed by the second multiplexing system 60 is reflected by the reflection mirror 70 to be subjected to image formation by the light modulator 80, following which the image formed by the light modulator 80 is projected onto an unillustrated screen by the projection lens 90.

In one embodiment where the light source unit 2 includes the phosphor wheel 5 illustrated by way of example in FIG. 3A, the blue laser light, the red fluorescence, and the green fluorescence may be emitted in a time-divisional manner, and thus illumination light formed by those pieces of light enters the third lens system 50. The illumination light from the light source unit 2 enters the second multiplexing system 60 through the third lens system 50. For example, in one embodiment where the light modulator 80 is configured by the DMD, micro mirrors thereof operate individually on the basis of image data supplied to the DMD. Pieces of light corresponding to respective colors of R, G, and B that have exited from the second multiplexing system 60 in a time-sequential manner enter the micro mirrors of the light modulator 80. The light modulator 80 time-divisionally displays color components, of a color image, corresponding to the respective colors of the pieces of light that have entered the light modulator 80. This allows for display of the color image on an unillustrated screen.

In one embodiment where the region 14 (see FIG. 3A) in the phosphor wheel 5 of the light source unit 2 is provided with the phosphor, the red fluorescence, the green fluorescence, and the blue fluorescence may be emitted in a time-divisional manner from the light source unit 2, and the illumination light formed by those pieces of light enters the third lens system 50.

In the optical engine 1 according to the first embodiment, it is possible to condense the fluorescence, emitted in the same direction as the laser light emitted from the semiconductor laser elements 10 in the light source unit 2, by the third lens system 50, and to multiplex the light condensed by the third lens system 50 by the second multiplexing system 60.

Second Embodiment

Figure 6:
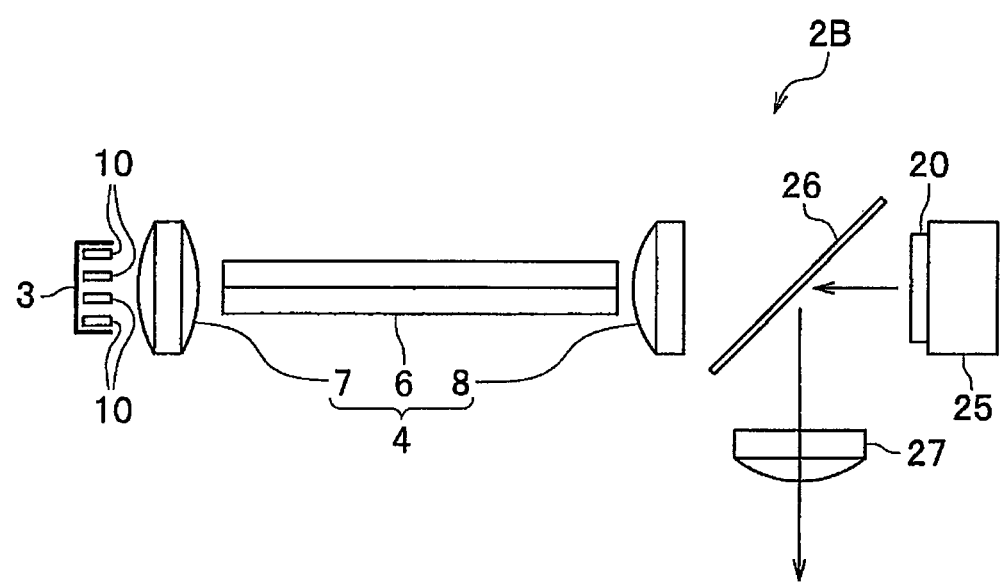
FIG. 6 schematically illustrates a configuration of a light source unit according to a second embodiment of the invention.

FIG. 6 schematically illustrates a light source unit 2B according to a second embodiment. The light source unit 2B may be incorporated in the optical engine 1 illustrated in FIG. 2 in place of the light source unit 2. Referring to FIG. 6, the light source unit 2B may include: the package 3 provided with the plurality of semiconductor laser elements 10; the optical system 4; a substrate 25 having the phosphor 20; a dichroic mirror 26; and a fluorescence receiving lens 27. It is to be noted that the same reference numerals are used to refer to the same or like elements as those of the light source unit 2 illustrated in FIG. 1, and such elements will not be described in detail where appropriate.

In the light source unit 2B, the substrate 25 having the phosphor 20 is fixed with respect to the optical system 4. The substrate 25 is so disposed that the multiplexed laser light beam that has exited from the second lens system 8 is applied substantially perpendicular to the plane arranged with the phosphor 20. A top surface of the substrate 25 serving as an arrangement surface of the phosphor 20 also serves as a reflection surface that reflects well the fluorescence emitted by the phosphor 20. The substrate 25 may be desirably in thermal contact with a heatsink such as a heat dissipation fin in order to release heat generated from the phosphor 20. The substrate 25 and the heatsink may be provided integrally.

The second lens system 8 in the optical system 4 may include a single lens. The dichroic mirror 26 is configured to allow a wavelength range of the multiplexed laser light beam that has exited from the second lens system 8 to be transmitted therethrough, and allow a wavelength range of the fluorescence emitted by the phosphor 20 to be reflected therefrom. The dichroic mirror 26 is disposed between the second lens system 8 and the substrate 25 to allow the fluorescence to be emitted in a direction different from a direction of the multiplexed laser light beam that has exited from the second lens system 8. More specifically, the dichroic mirror 26 is disposed on an optical axis of the multiplexing optical member 6 at a predetermined angle to the optical axis, and reflects the fluorescence emitted by the phosphor 20 to change a direction of the fluorescence. For example, when the dichroic mirror 26 is inclined at an angle of 45 degrees, the dichroic mirror 26 changes the direction of the fluorescence at 90 degrees angle.

The fluorescence receiving lens 27 is configured to cause the fluorescence emitted from the phosphor 20 to be substantially parallel light. The fluorescence receiving lens 27 is located at a position that is away from the optical axis of the multiplexing optical member 6 and on an optical axis of the light reflected by the dichroic mirror 26. For example, when the dichroic mirror 26 is inclined at an angle of 45 degrees, the optical axis of the fluorescence receiving lens 27 is orthogonal to the optical axis of the multiplexing optical member 6.

In the light source unit 2B, the multiplexed laser light beam that has exited from the second lens system 8 passes through the dichroic mirror 26 to be applied substantially perpendicular to the plane, on the substrate 25, in which the phosphor 20 is arranged. The fluorescence emitted by the phosphor 20 is changed by the dichroic mirror 26 to travel in a light path different from a light path of the light emitted by the semiconductor laser elements 10, following which the fluorescence travels through the fluorescence receiving lens 27 to be spatially propagated to an unillustrated optical device.

It is possible for the light source unit 2B to separate the multiplexed laser light beam that has exited from the second lens system 8 and the fluorescence emitted from the phosphor 20 on the substrate 25 by the dichroic mirror 26. Because the light source unit 2B includes the phosphor 20 not at the phosphor wheel 5 but at the substrate 25 that is fixed with respect to the optical system 4, it is not necessary to move the substrate 25 in the light source unit 2B.

[Modification of Light Source Unit 2B]

The substrate 25 having the phosphor 20 in the light source unit 2B may be replaced by the phosphor wheel 5 illustrated in FIG. 1. A light source unit 2C illustrated in FIG. 7 may include the package 3, the optical system 4, the phosphor wheel 5, the dichroic mirror 26, and the fluorescence receiving lens 27. The phosphor wheel 5 is so disposed that the multiplexed laser light beam that has exited from the second lens system 8 is applied substantially perpendicular to the plane, on the substrate of the phosphor wheel 5, in which the phosphor 20 is arranged. In the present modification, providing the phosphor wheel 5 with the heatsink may be eliminated.

The light source unit 2C may be provided with the transmissive phosphor wheel 5, or may be provided with the reflective phosphor wheel 5. In one embodiment where the light source unit 2C includes the reflective phosphor wheel 5 having the shape illustrated by way of example in FIG. 3A, the light source unit 2C emits illumination light formed by the blue light and fluorescence, i.e., red fluorescence and green fluorescence, emitted in a direction different from that of the blue light.

Figure 7:
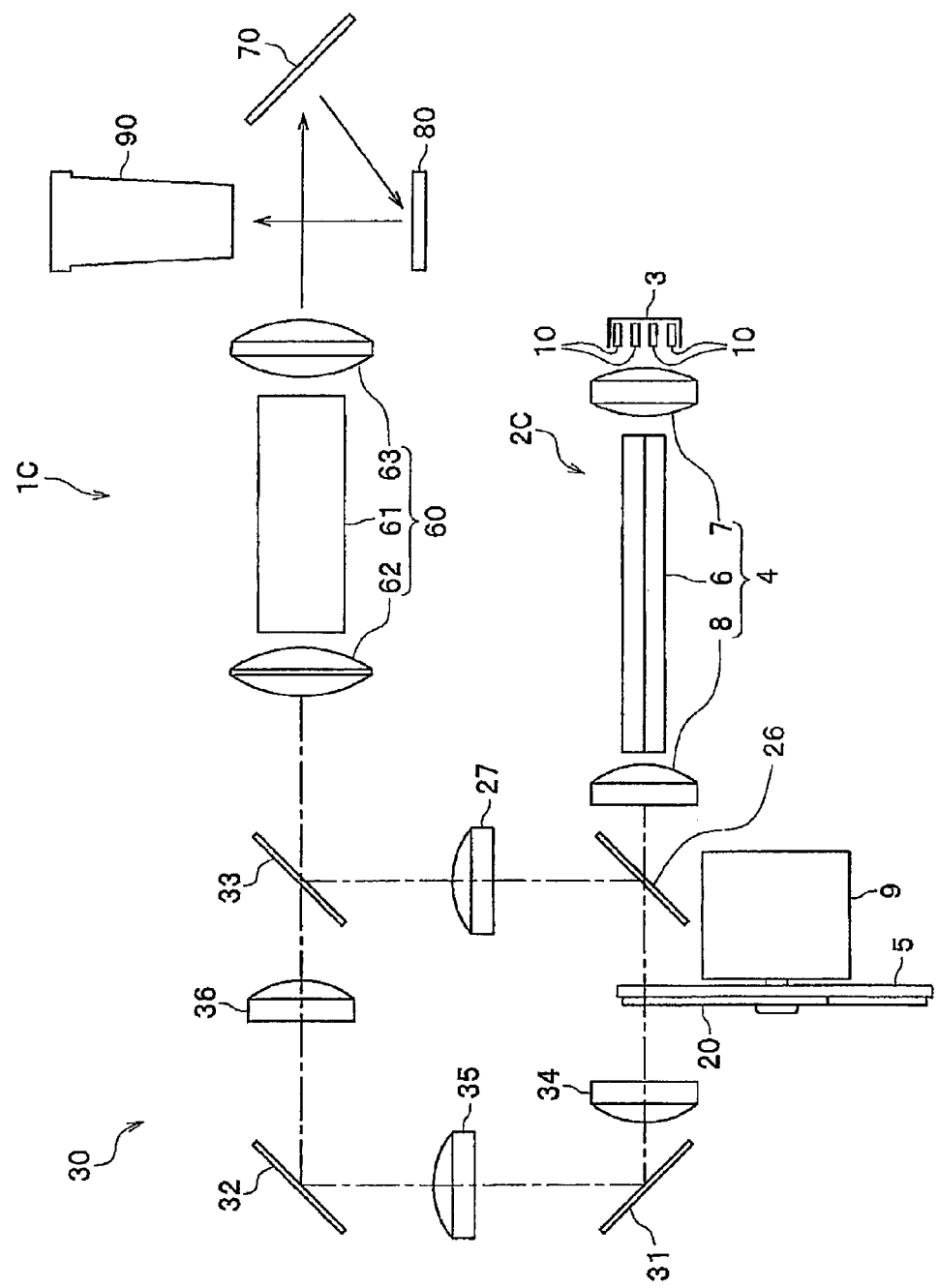
FIG. 7 schematically illustrates a configuration of a light source unit and a configuration of an optical engine according to a modification of the second embodiment of the invention.

An optical engine 1C illustrated in FIG. 7 may be configured by incorporating therein the light source unit 2C that includes the reflective phosphor wheel 5. The optical engine 1C may include the light source unit 2C, an optical system 30, the second multiplexing system 60, the reflection mirror 70, the light modulator 80, and the projection lens 90. The optical system 30 is configured to spatially propagate the laser light that has exited from the second lens system 8 without absorption by the one or more kinds of phosphor 20 in the light source unit 2C. It is to be noted that the same reference numerals are used to refer to the same or like elements as those of the optical engine 1 illustrated in FIG. 2, and such elements will not be described in detail where appropriate.

The optical system 30 causes the blue light having passed through the phosphor wheel 5 in the light source unit 2C to spatially propagate to guide the blue light to the second multiplexing system 60. For example, the optical system 30 may include reflection mirrors 31 and 32, a dichroic mirror 33, and condenser lenses 34, 35, and 36 at respective predetermined positions, in order to condense the blue light on the second multiplexing system 60. The dichroic mirror 33 is configured to allow a wavelength range of the multiplexed laser light beam that has exited from the second lens system 8 to pass therethrough, and allow a wavelength range of the fluorescence emitted by the phosphor 20 to be reflected therefrom. The condenser lens 34 may be disposed between the phosphor wheel 5 and the reflection mirror 31. The condenser lens 35 may be disposed between the reflection mirrors 31 and 32. The condenser lens 36 may be disposed between the reflection mirror 32 and the dichroic mirror 33.

The blue light having passed through the dichroic mirror 26 and having further passed through the region 14 of the phosphor wheel 5 in the light source unit 2C enters the optical system 30. The blue light is then condensed by the condenser lens 34, following which the condensed blue light is changed in direction by the reflection mirror 31 at an angle of 90 degrees. Further, the blue light thus reflected by the reflection mirror 31 is further condensed by the condenser lens 35, following which the condensed blue light is changed in direction by the reflection mirror 32 at an angle of 90 degrees. The blue light thus reflected by the reflection mirror 32 is condensed by the condenser lens 36 to pass through the dichroic mirror 33. The blue light having thus passed through the dichroic mirror 33 enters the second multiplexing system 60.

On the other hand, the red fluorescence and the green fluorescence, emitted respectively by the red phosphor 20R and the green phosphor 20G of the phosphor wheel 5 in the light source unit 2C, are reflected by the dichroic mirror 26 at an angle of 90 degrees, following which the red fluorescence and the green fluorescence thus reflected are each caused to be substantially parallel light by the fluorescence receiving lens 27. Those red fluorescence and green fluorescence are then reflected by the dichroic mirror 33 of the optical system 30 at an angle of 90 degrees to enter the second multiplexing system 60.

It is possible for the optical engine 1C, by including the optical system 30, to cause the multiplexed laser light beam that has exited from the second lens system 8 and each fluorescence emitted by the phosphor wheel 5 in the light source unit 2C to enter the second multiplexing system 60 via different light paths from one another.

Third Embodiment

Figure 8:
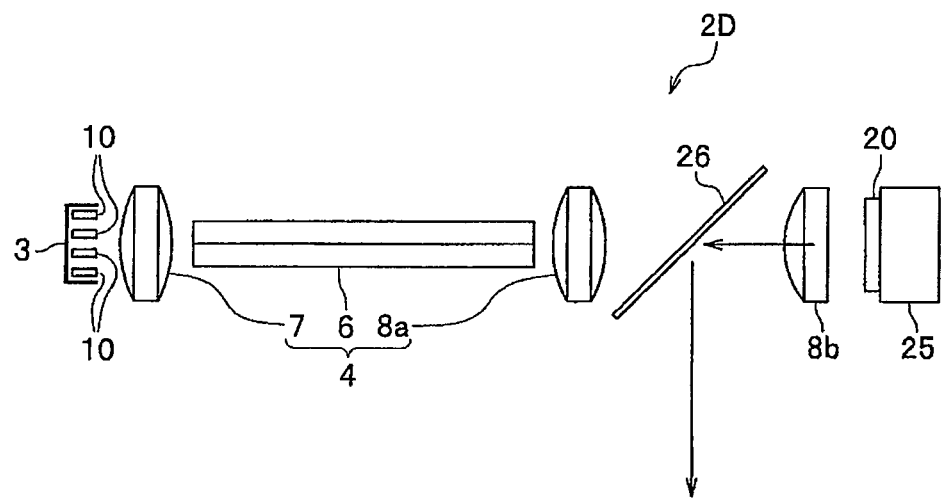
FIG. 8 schematically illustrates a configuration of a light source unit according to a third embodiment of the invention.

FIG. 8 schematically illustrates a light source unit 2D according to a third embodiment. The light source unit 2D may be incorporated in the optical engine 1 illustrated in FIG. 2 in place of the light source unit 2. Referring to FIG. 8, the light source unit 2D may include: the package 3 provided with the plurality of semiconductor laser elements 10; the optical system 4; the substrate 25 having the phosphor 20; and the dichroic mirror 26. It is to be noted that the same reference numerals are used to refer to the same or like elements as those of the light source unit 2B illustrated in FIG. 6, and such elements will not be described in detail where appropriate.

In the light source unit 2D, the substrate 25 having the phosphor 20 is fixed with respect to the optical system 4. The substrate 25 is so disposed that the multiplexed laser light beam that has exited from the second lens system 8 is applied substantially perpendicular to the plane arranged with the phosphor 20. The top surface of the substrate 25 serving as the arrangement surface of the phosphor 20 also serves as the reflection surface that reflects well the fluorescence emitted by the phosphor 20. The substrate 25 may be desirably in thermal contact with a heatsink such as the heat dissipation fin in order to release heat generated from the phosphor 20. The substrate 25 and the heatsink may be provided integrally.

The second lens system 8 in the optical system 4 includes two lenses 8a and 8b. The lens 8a is disposed to face the multiplexing optical member 6, and causes the laser light that has exited from the package 3 to be substantially parallel light. The lens 8*b* is disposed to face the substrate 25 at a position closest to the phosphor 20, and has functions of condensing the laser light that has exited from the package 3 and receiving the fluorescence emitted from the substrate 25.

In the present embodiment, the dichroic mirror 26 is disposed between the lenses 8*a* and 8*b* that configure the second lens system 8. Hence, in the light source unit 2D, the laser light derived from the package 3 passes through the lens 8*a* and the dichroic mirror 26, following which the laser light having passed therethrough further passes through the lens 8*b* to be applied substantially perpendicular to the plane, on the substrate 25, arranged with the phosphor 20. The fluorescence emitted by the phosphor 20 is caused to be the parallel light substantially by the lens 8*b*. The fluorescence thus caused to be the parallel light substantially is reflected by the dichroic mirror 26 to be changed in light path thereof followed by spatial propagation to an unillustrated optical device.

It is possible for the light source unit 2D to separate the multiplexed laser light beam that has exited from the second lens system 8 and the fluorescence emitted from the phosphor 20 on the substrate 25 by the dichroic mirror 26. Also, between the two lenses 8*a* and 8*b* that configure the second lens system 8, the lens 8*b* disposed on the substrate 25 side causes the fluorescence as the diverging light emitted from the phosphor 20 to be the parallel light substantially. Hence, it is not necessary to provide, in a light path of the fluorescence reflected by the dichroic mirror 26, a lens that causes the fluorescence to be the parallel light substantially.

[Modification of Light Source Unit 2D]

The substrate 25 having the phosphor 20 in the light source unit 2D may be replaced by the phosphor wheel 5 illustrated in FIG. 1. In the present modification, the light source unit 2D may include the package 3, the optical system 4, the phosphor wheel 5, and the dichroic mirror 26 which are unillustrated. The second lens system 8 in the optical system 4 includes the two lenses 8*a* and 8*b*. The phosphor wheel 5 is so disposed that the multiplexed laser light beam that has exited from the second lens system 8 is applied substantially perpendicular to the plane arranged with the phosphor 20 of the phosphor wheel 5.

As with the light source unit 2C described above, the light source unit 2D according to the present modification may be provided with the transmissive phosphor wheel 5, or may be provided with the reflective phosphor wheel 5. The light source unit 2D provided with the reflective phosphor wheel 5 may be incorporated in the optical engine 1C illustrated in FIG. 7 in place of the light source unit 2C.

Fourth Embodiment

Figure 9:
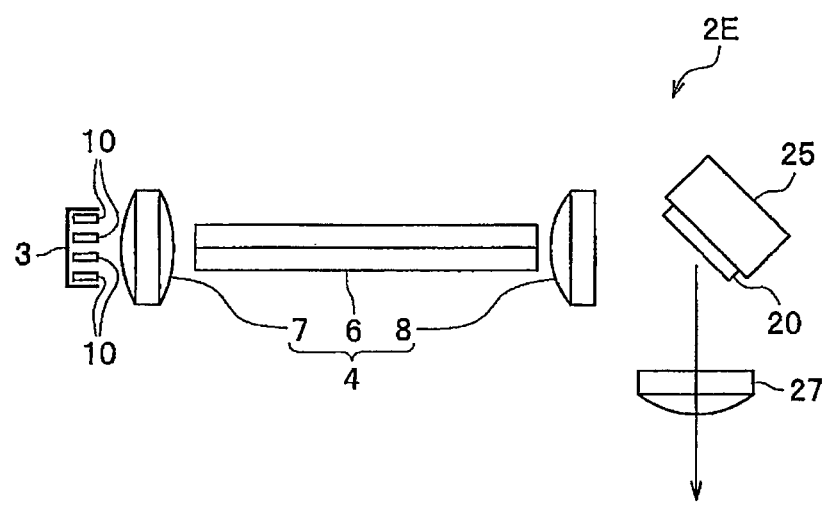
FIG. 9 schematically illustrates a configuration of a light source unit according to a fourth embodiment of the invention.

FIG. 9 schematically illustrates a light source unit 2E according to a fourth embodiment. The light source unit 2E may be incorporated in the optical engine 1 illustrated in FIG. 2 in place of the light source unit 2. Referring to FIG. 9, the light source unit 2E may include: the package 3 provided with the plurality of semiconductor laser elements 10; the optical system 4; the substrate 25 having the phosphor 20; and the fluorescence receiving lens 27. It is to be noted that the same reference numerals are used to refer to the same or like elements as those of the light source unit 2B illustrated in FIG. 6, and such elements will not be described in detail where appropriate.

In the light source unit 2E, the substrate 25 having the phosphor 20 is fixed with respect to the optical system 4. The substrate 25 is so disposed that the multiplexed laser light beam that has exited from the second lens system 8 is applied non-perpendicular to the plane arranged with the phosphor 20. The top surface of the substrate 25 serving as the arrangement surface of the phosphor 20 also serves as the reflection surface that reflects well the fluorescence emitted by the phosphor 20. FIG. 9 illustrates one embodiment where the substrate 25 is so disposed that the top surface of the substrate 25 serving as the arrangement surface of the phosphor 20 is inclined at an angle of 45 degrees to the optical axis of the light derived from the semiconductor laser elements 10. The substrate 25 may be desirably in thermal contact with the heatsink such as a heat dissipation fin in order to release heat generated from the phosphor 20. The substrate 25 and the heatsink may be provided integrally.

The second lens system 8 in the optical system 4 includes a single lens. The fluorescence receiving lens 27 is located at a position that is away from the optical axis of the multiplexing optical member 6 and on an optical axis of the light reflected by the top surface of the substrate 25 having the phosphor 20. The angle of inclination of the substrate 25 may be other than 45 degrees depending on an arrangement of the fluorescence receiving lens 27. Also, the fluorescence receiving lens 27 may be located at a position that is away from the optical axis of the multiplexing optical member 6 and away from the optical axis of the light reflected by the top surface of the substrate 25 having the phosphor 20. For example, the optical axis of the fluorescence receiving lens 27 may be substantially perpendicular to the substrate 25 having the phosphor 20.

In the light source unit 2E, the laser light emitted from the package 3 is applied, through the optical system 4, to the phosphor 20 that is inclined to the optical axis of the multiplexed laser light beam that has exited from the second lens system 8. The fluorescence emitted by the phosphor 20 travels along a light path that is different from a light path of the light emitted by the semiconductor laser elements 10. The fluorescence thus emitted by the phosphor 20 travels through the fluorescence receiving lens 27 to be spatially propagated to an unillustrated optical device.

In the light source unit 2E, the substrate 25 having the phosphor 20 is so disposed as to be inclined to the optical axis of the multiplexed laser light beam that has exited from the second lens system 8. Thus, it is possible for the light source unit 2E to separate the multiplexed laser light beam that has exited from the second lens system 8 and the fluorescence emitted from the phosphor 20 on the substrate 25. Hence, it is possible to eliminate the use of a particular component that separates the laser light from the fluorescence.

[Modification of Light Source Unit 2E]

The substrate 25 having the phosphor 20 in the light source unit 2E may be replaced by the phosphor wheel 5 illustrated in FIG. 1. In the present modification, the light source unit 2E may include the package 3, the optical system 4, the phosphor wheel 5, and the fluorescence receiving lens 27 which are unillustrated. The phosphor wheel 5 may be so disposed that the multiplexed laser light beam that has exited from the second lens system 8 is applied non-perpendicular, for example, being inclined at an angle of 45 degrees, to the plane arranged with the phosphor 20 of the phosphor wheel 5, for example.

As with the light source unit 2C described above, the light source unit 2E according to the present modification may be provided with the transmissive phosphor wheel 5, or may be provided with the reflective phosphor wheel 5. The light source unit 2E provided with the reflective phosphor wheel 5 may be incorporated in the optical engine 1C illustrated in FIG. 7 in place of the light source unit 2C.

The foregoing description is intended to provide non-limiting illustrative examples directed to a light source unit and an optical engine as some example embodiments that embody the inventive concept of the invention, and is not to be construed as limiting the invention. Also, the description provided herein is not to be construed as limiting the elements recited in the appended claims to those described in the embodiments described above. Factors such as sizes, materials, shapes, and relative arrangements of respective components described in the embodiments described above are for illustration purposes only and are not to be construed as limiting the elements recited in the appended claims to those unless otherwise specified. Further, the elements constructing the invention may be so configured that the plurality of elements are configured by the same member to allow one member to serve as that plurality of elements, or may be so configured that a function of one member is shared with a plurality of members to achieve that function.

It is sufficient for each of the light source units 2, 2B, 2C, 2D, and 2E to have at least one kind of phosphor on the substrate. For example, in one embodiment where the phosphors of three colors (such as red, green, and blue) are arranged on a single substrate and are excited by the laser light, white fluorescence in which those three colors are mixed is emitted. The substrate in which one kind of phosphor is disposed may be used to configure a light source unit that emits white light with use of fluorescence or a combination of fluorescence and laser light, by further providing, on an optical axis, another substrate in which another kind of phosphor is disposed, for example. The light source unit that emits white light in which three colors are mixed may be incorporated in any of the optical engines 1 and 1C, and a three-color separation prism and light modulator 80R, 80G, and 80B corresponding to the respective colors may be included in any of the optical engines 1 and 1C. In such an embodiment, the white light emitted by the light source unit is separated into three colors (such as red light, green light, and blue light) by the three-color separation prism, following which the red light, the green light, and the blue light are caused to enter the respective light modulators 80R, 80G, and 80B to allow pieces of light modulated by the respective light modulators 80R, 80G, and 80B to be projected onto a screen.

Further, in each of the example embodiments described above, shapes and arrangements of respective lenses and the number of lenses are illustrative and non-limiting. Each of the lenses may be configured by a plurality of lenses. Also, each of the lenses is not limited in shape to a planoconvex lens or a biconvex lens, and may be a meniscus lens, a planoconcave lens, or a biconcave lens.

Furthermore, the invention encompasses any possible combination of some or all of the various embodiments described herein and incorporated herein.

It is possible to achieve at least one of the following configurations from the above-described example embodiments of the invention.

(1) A light source unit that emits at least fluorescence, the light source unit including:
one or more kinds of phosphor;
a substrate, on which the one or more kinds of phosphor is applied;
a plurality of semiconductor laser elements arrayed at a predetermined interval in a package, wherein each of the semiconductor laser elements emits a laser light beam through a light emission region; and
a first optical system that comprises a first lens system, a multiplexing optical member having a light entering surface and a light exiting surface, and a second lens system, wherein the first optical system directs the laser light beams emitted from the respective semiconductor laser elements toward the substrate,
the first lens system receives the laser light beams emitted from the respective semiconductor laser elements directly without substantial parallelization of the respective received laser light beams, and condenses the received laser light beams on the light entering surface of the multiplexing optical member,
the multiplexing optical member multiplexes the laser light beams condensed by the first lens system, into a multiplexed laser light beam having a spatially-uniform intensity distribution, and
the second lens system condenses the multiplexed laser light beam that has exited from the light exiting surface of the multiplexing optical member onto the one or more kinds of phosphor.

(2) The light source unit according to (1), wherein
the substrate is a wheel on which the one or more kinds of phosphor applied to the substrate is coated on or embedded in the substrate, and
the one or more kinds of phosphor of the substrate emits the fluorescence when a region of the substrate, on which the one or more kinds of phosphor is applied, is exposed to the multiplexed laser light beam.

(3) The light source unit according to (2), wherein the substrate is circular, and comprises one or more phosphor-containing regions and a transmission region that are provided in a circumferential direction, the one or more phosphor-containing regions is provided with the respective one or more kinds of phosphor, and the transmission region is provided with no phosphor and the transmission region is transparent to the multiplexed laser light beam.

(4) The light source unit according to (2), wherein the substrate is circular, and includes an annular region in which the one or more kinds of phosphor is applied in an annular shape, the annular region including one or more regions is arranged in a circumferential direction, and the number of the one or more regions corresponds to the number of kinds of the one or more kinds of phosphor.

(5) The light source unit according to (1), wherein the substrate is fixed with respect to the first optical system, and emits the fluorescence in a direction different from the incident direction of the multiplexed laser light beam.

(6) The light source unit according to any one of (1) to (5), wherein the multiplexing optical member is one of a rod integrator and a light pipe, and the light entering surface and the light exiting surface have same polygon shape.

(7) The light source unit according to (6), wherein the shape of the light entering surface of the multiplexing optical member is selected from a group consisting of tetragon, pentagon, and hexagon.

(8) The light source unit according to any one of (1) to (7), wherein a minimum diameter of the light entering surface of the multiplexing optical member is larger than the interval of the semiconductor laser elements and smaller than a maximum dimension of a surface shape of the light emission region in the package.

(9) The light source unit according to any one of (1) to (8), wherein the first lens system comprises a single lens that is larger than a maximum dimension of a surface shape of the light emission region in the package.

(10) The light source unit according to any one of (1) to (9), wherein at a surface of the phosphor-containing region, the multiplexed laser light beam has a half width of a light intensity distribution at least 80% with respect to a width at an intensity of 1/e2 to the center intensity, where e is the base of the natural logarithm.

(11) The light source unit according to any one of (1) to (10), further including a dichroic mirror and a fluorescence receiving lens, wherein the substrate is disposed with respect to the second lens system so that the multiplexed laser light beam is perpendicularly incident to the phosphors on the substrate surface, and the fluorescence is emitted in a direction different from the incident direction of the multiplexed laser light beam, the second lens system comprises a single lens, the dichroic mirror is provided between the single lens and the substrate to transmit therethrough a light of wavelength range of the multiplexed laser light beam, and to reflect therefrom a light of wavelength range of the fluorescence emitted by the one or more kinds of phosphor, and the fluorescence receiving lens parallelizes the fluorescence reflected from the dichroic mirror.

(12) The light source unit according to any one of (1) to (10), further including a dichroic mirror, wherein the substrate is disposed with respect to the second lens system so that the multiplexed laser light beam is perpendicularly incident to the phosphors on the substrate surface, and the fluorescence light is emitted in a direction different from the incident direction of the multiplexed laser light beam, the second lens system includes two lenses, and the dichroic mirror is provided between the two lenses, and to transmit therethrough a light of wavelength range of the multiplexed laser light beam, and to reflect therefrom a light of wavelength range of the fluorescence emitted by the one or more kinds of phosphor, and the fluorescence receiving lens parallelizes the fluorescence reflected from the dichroic mirror.

(13) The light source unit according to any one of (1) to (10), further including a fluorescence receiving lens, wherein the substrate is disposed with respect to the second lens system so that the multiplexed laser light beam is non-perpendicularly incident to the phosphors on the substrate surface, and the fluorescence is emitted in a direction different from the incident direction of the multiplexed laser light beam, the second lens system comprises a single lens, and the fluorescence receiving lens parallelizes the fluorescence emitted by the phosphor.

(14) An optical engine, including:

the light source unit according to any one of (1) to (13);

a third lens system that condenses at least the fluorescence in the light emitted from the light source unit;

a second multiplexing optical member that multiplexes the light condensed by the third lens system, and wherein the second multiplexing optical member is one of a rod integrator and a light pipe;

a light modulator that modulates the light multiplexed by the second multiplexing optical member; and a projection lens that projects the light modulated by the light modulator.

(15). An optical engine, including:

the light source unit according to any one of (1) to (13);
a fluorescence receiving lens parallelizes the fluorescence emitted by the phosphor; a second optical system directs the laser light beam that has exited from the second lens system;

a second multiplexing optical member including a rod integrator or a light pipe that multiplexes the fluorescence passed through the fluorescence receiving lens and the laser light beam passed through the second optical system;

a light modulator that modulates the light multiplexed by the second multiplexing optical member; and a projection lens that projects the light modulated by the light modulator.

(1') A light source unit configured to emit at least fluorescence, the light source unit including:

a substrate having one or more kinds of phosphor;

a plurality of semiconductor laser elements arrayed at a predetermined pitch in a package and each configured to emit a laser light beam; and a first optical system including a first lens system, a multiplexing optical member having a light entering surface and a light exiting surface, and a second lens system, the first optical system being configured to apply the laser light beams emitted from the respective semiconductor laser elements onto the substrate, the first lens system being configured to receive the laser light beams emitted from the respective semiconductor laser elements directly without substantial parallelization of the respective received laser light beams, and allow the received laser light beams to be condensed on the light entering surface of the multiplexing optical member, the multiplexing optical member being configured to multiplex laser light beams that have been emitted from the respective semiconductor laser elements and condensed by the first lens system, into a multiplexed laser light beam having a spatially-uniform intensity distribution, and the second lens system being configured to allow the multiplexed laser light beam that has exited from the light exiting surface of the multiplexing optical member to be condensed onto the one or more kinds of phosphor.

(2') The light source unit according to (1'), wherein the substrate includes a wheel substrate having the one or more kinds of phosphor that is coated thereon or embedded therein, and the one or more kinds of phosphor of the substrate emits the fluorescence in response to presence of the one or more kinds of phosphor in a region of the substrate, the region being applied with the multiplexed laser light beam that has exited from the second lens system.

(3') The light source unit according to (2'), wherein the substrate is circular, and includes one or more phosphor regions and a transmission region that are provided in a circumferential direction, the one or more phosphor regions being provided with the respective one or more kinds of phosphor, and the transmission region being provided with no phosphor and allowing the multiplexed laser light beam that has exited from the second lens system to be transmitted therethrough.

(4') The light source unit according to (2'), wherein the substrate is circular, and includes an annular region in which the one or more kinds of phosphor is arranged in an annular shape, the annular region including one or more regions arranged in a circumferential direction, and the number of the one or more regions corresponding to the number of kinds of the one or more kinds of phosphor.

(5') The light source unit according to (1'), wherein the substrate is fixed with respect to the first optical system, and emits the fluorescence in a direction different from a direction of the multiplexed laser light beam that has exited from the second lens system.

(6') The light source unit according to any one of (1') to (5'), wherein the multiplexing optical member is one of a rod integrator and a light pipe, and the light entering surface and the light exiting surface have same polygon shape.

(7') The light source unit according to (6'), wherein the shape of the light entering surface of the multiplexing optical member is selected from a group consisting of tetragon, pentagon, and hexagon.

(8') The light source unit according to any one of (1') to (7'), wherein the light entering surface of the multiplexing optical member has a minimum diameter that is larger than the pitch of the semiconductor laser elements and smaller than a maximum diameter of a, surface shape of a light emission region in the package.

(9') The light source unit according to any one of (1') to (8'), wherein the first lens system is configured of a single lens that is larger than a maximum diameter of a surface shape of a light emission region in the package.

(10') The light source unit according to any one of (1') to (9'), wherein a half width of a light intensity distribution of the multiplexed laser light beam, at a position onto which the multiplexed laser light beam is applied of a phosphor-arranged plane of the substrate, is equal to at least 80 percent of a distribution width defined by an intensity that is $1/e^2$ of an intensity at center of the light intensity distribution, where e is the base of the natural logarithm.

(11') The light source unit according to any one of (1') to (10'), further including a dichroic mirror and a fluorescence receiving lens, wherein the substrate is disposed to allow the multiplexed laser light beam that has exited from the second lens system to be applied substantially perpendicular to a phosphor-arranged plane of the substrate, and to allow the fluorescence to be emitted therefrom in a direction different from a direction of the multiplexed laser light beam, the second lens system includes a single lens, the dichroic mirror is provided between the single lens and the substrate, and configured to allow a wavelength range of the multiplexed laser light beam to be transmitted therethrough, and reflect therefrom a wavelength range of the fluorescence emitted by the one or more kinds of phosphor, and the fluorescence receiving lens is configured to cause the fluorescence reflected from the dichroic mirror to be substantially parallel light.

(12') The light source unit according to any one of (1') to (10'), further including a dichroic mirror, wherein the substrate is disposed to allow the multiplexed laser light beam that has exited from the second lens system to be applied substantially perpendicular to a phosphor-arranged plane of the substrate, and to allow the fluorescence to be emitted therefrom in a direction different from a direction of the multiplexed laser light beam, the second lens system includes two lenses, and the dichroic mirror is provided between the two lenses, and configured to allow a wavelength range of the multiplexed laser light beam to be transmitted therethrough, and reflect therefrom a wavelength range of the fluorescence emitted by the one or more kinds of phosphor.

(13') The light source unit according to any one of (1') to (10'), further including a fluorescence receiving lens, wherein the substrate is disposed to allow the multiplexed laser light beam that has exited from the second lens system to be applied non-perpendicular to a phosphor-arranged plane of the substrate, and to allow the fluorescence to be emitted therefrom in a direction different from a direction of the multiplexed laser light beam, the second lens system includes a single lens, and the fluorescence receiving lens is configured to cause the fluorescence emitted by the one or more kinds of phosphor to be substantially parallel light.

(14') An optical engine, including:

the light source unit according to any one of (1') to (13');

a third lens system configured to condense at least the fluorescence in light emitted from the light source unit;

a second multiplexing optical member configured to multiplex light condensed by the third lens system, the second multiplexing optical member being one of a rod integrator and a light pipe;

a light modulator configured to modulate light multiplexed by the second multiplexing optical member; and a projection lens configured to project light modulated by the light modulator.

(15') An optical engine, including:

the light source unit according to any one of (1') to (13');

a fluorescence receiving lens configured to cause the fluorescence emitted from the one or more kinds of phosphor in the light source unit to be substantially parallel light;

a second optical system configured to spatially propagate the laser light beam that has exited from the second lens system without absorption by the one or more kinds of phosphor in the light source unit;

a second multiplexing optical member configured to multiplex the fluorescence having passed through the fluorescence receiving lens and the laser light beam having spatially propagated through the second optical system, the second multiplexing optical member being one of a rod integrator and a light pipe;

a light modulator configured to modulate light multiplexed by the second multiplexing optical member; and a projection lens configured to project light modulated by the light modulator.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations as used herein are defined as being largely but not necessarily wholly what is specified as understood by one of ordinary skill in the art. Also, the term "about", "approximately", or the like as used herein can allow for a degree of variability in a value or range. Moreover, no element or component in this disclosure is intended to be dedicated to the public regardless of whether the element or component is explicitly recited in the following claims.

What is claimed is:

1. A light source unit that emits at least fluorescence, the light source unit comprising:
    one or more kinds of phosphor;
    a substrate, on which the one or more kinds of phosphor is applied;
    a plurality of semiconductor laser elements arrayed at a predetermined interval in a package, wherein each of the semiconductor laser elements emits a laser light beam through a light emission region; and
a first optical system that comprises a first lens system, a multiplexing optical member having a light entering surface and a light exiting surface, and a second lens system,
wherein the first optical system directs the laser light beams emitted from the respective semiconductor laser elements toward the substrate,
wherein the first lens system receives the laser light beams emitted from the respective semiconductor laser elements directly without substantial parallelization of the respective received laser light beams, and condenses the received laser light beams on the light entering surface of the multiplexing optical member,
wherein the multiplexing optical member multiplexes the laser light beams condensed by the first lens system, into a multiplexed laser light beam having a spatially-uniform intensity distribution,
wherein the second lens system condenses the multiplexed laser light beam that has exited from the light exiting surface of the multiplexing optical member onto the one or more kinds of phosphor, and
wherein a minimum diameter of the light entering surface of the multiplexing optical member is larger than the interval of the semiconductor laser elements and smaller than a maximum dimension of a surface shape of the light emission region in the package.

2. The light source unit according to claim 1, wherein:
the substrate is a wheel on which the one or more kinds of phosphor applied to the substrate is coated on or embedded in the substrate, and
the one or more kinds of phosphor of the substrate emits the fluorescence when a region of the substrate, on which the one or more kinds of phosphor is applied, is exposed to the multiplexed laser light beam.

3. The light source unit according to claim 2, wherein:
the substrate is circular and comprises one or more phosphor-containing regions and a transmission region that are provided in a circumferential direction,
the one or more phosphor-containing regions is provided with the respective one or more kinds of phosphor, and
the transmission region is provided with no phosphor and the transmission region is transparent to the multiplexed laser light beam.

4. The light source unit according to claim 2, wherein:
the substrate is circular and includes an annular region in which the one or more kinds of phosphor is applied in an annular shape,
the annular region including one or more regions is arranged in a circumferential direction, and
the number of the one or more regions corresponds to the number of kinds of the one or more kinds of phosphor.

5. The light source unit according to claim 1, wherein the substrate is fixed with respect to the first optical system, and emits the fluorescence in a direction different from an incident direction of the multiplexed laser light beam.

6. The light source unit according to claim 1, wherein the multiplexing optical member is one of a rod integrator and a light pipe, and the light entering surface and the light exiting surface have a same polygonal shape.

7. The light source unit according to claim 6, wherein a shape of the light entering surface of the multiplexing optical member is selected from a group consisting of tetragon, pentagon, and hexagon.

8. The light source unit according to claim 1, wherein the first lens system comprises a single lens that is larger than a maximum dimension of a surface shape of the light emission region in the package.

9. The light source unit according to claim 1, wherein at a surface of the phosphor-containing region, the multiplexed laser light beam has a half width of a light intensity distribution at least 80% with respect to a width at an intensity of $1/e^2$ to the center intensity, where e is the base of the natural logarithm.

10. The light source unit according to claim 1, further comprising a dichroic mirror and a fluorescence receiving lens, wherein:
the substrate is disposed with respect to the second lens system so that the multiplexed laser light beam is perpendicularly incident to the phosphors on the substrate surface, and the fluorescence is emitted in a direction different from the incident direction of the multiplexed laser light beam,
the second lens system comprises a single lens,
the dichroic mirror is provided between the single lens and the substrate to transmit therethrough a light of wavelength range of the multiplexed laser light beam, and to reflect therefrom a light of wavelength range of the fluorescence emitted by the one or more kinds of phosphor, and
the fluorescence receiving lens parallelizes the fluorescence reflected from the dichroic mirror.

11. The light source unit according to claim 1, further comprising a dichroic mirror, wherein:
the substrate is disposed with respect to the second lens system so that the multiplexed laser light beam is perpendicularly incident to the phosphors on the substrate surface, and the fluorescence light is emitted in a direction different from the incident direction of the multiplexed laser light beam,
the second lens system includes two lenses,
the dichroic mirror is provided between the two lenses to transmit therethrough a light of wavelength range of the multiplexed laser light beam, and to reflect therefrom a light of wavelength range of the fluorescence emitted by the one or more kinds of phosphor, and
the fluorescence receiving lens parallelizes the fluorescence reflected from the dichroic mirror.

12. The light source unit according to claim 1, further comprising a fluorescence receiving lens, wherein:
the substrate is disposed with respect to the second lens system so that the multiplexed laser light beam is non-perpendicularly incident to the phosphors on the substrate surface, and the fluorescence is emitted in a direction different from the incident direction of the multiplexed laser light beam,
the second lens system comprises a single lens, and
the fluorescence receiving lens parallelizes the fluorescence emitted by the phosphor.

13. An optical engine, comprising:
the light source unit according to claim 1;
a third lens system that condenses at least the fluorescence in the light emitted from the light source unit;
a second multiplexing optical member that multiplexes the light condensed by the third lens system, and wherein the second multiplexing optical member is one of a rod integrator and a light pipe;
a light modulator that modulates the light multiplexed by the second multiplexing optical member; and
a projection lens that projects the light modulated by the light modulator.

14. An optical engine, comprising:
the light source unit according to claim 1;
a fluorescence receiving lens parallelizes the fluorescence emitted by the phosphor;
a second optical system directs the laser light beam that has exited from the second lens system;
a second multiplexing optical member including a rod integrator or a light pipe that multiplexes the fluorescence passed through the fluorescence receiving lens and the laser light beam passed through the second optical system;
a light modulator that modulates the light multiplexed by the second multiplexing optical member; and
a projection lens that projects the light modulated by the light modulator.

15. An optical engine, comprising:
the light source unit according to claim 3;
a third lens system that condenses at least the fluorescence in the light emitted from the light source unit;
a second multiplexing optical member that multiplexes the light condensed by the third lens system, and wherein the second multiplexing optical member is one of a rod integrator and a light pipe;
a light modulator that modulates the light multiplexed by the second multiplexing optical member; and
a projection lens that projects the light modulated by the light modulator.

16. An optical engine, comprising:
the light source unit according to claim 3;
a fluorescence receiving lens parallelizes the fluorescence emitted by the phosphor;
a second optical system directs the laser light beam that has exited from the second lens system;
a second multiplexing optical member including a rod integrator or a light pipe that multiplexes the fluorescence passed through the fluorescence receiving lens and the laser light beam passed through the second optical system;
a light modulator that modulates the light multiplexed by the second multiplexing optical member; and
a projection lens that projects the light modulated by the light modulator.

17. A light source unit that emits at least fluorescence, the light source unit comprising:
one or more kinds of phosphor;
a substrate, on which the one or more kinds of phosphor is applied;
a plurality of semiconductor laser elements arrayed at a predetermined interval in a package, wherein each of the semiconductor laser elements emits a laser light beam through a light emission region; and
a first optical system that comprises a first lens system, a multiplexing optical member having a light entering surface and a light exiting surface, and a second lens system,
wherein the first optical system directs the laser light beams emitted from the respective semiconductor laser elements toward the substrate,
wherein the first lens system receives the laser light beams emitted from the respective semiconductor laser elements directly without substantial parallelization of the respective received laser light beams, and condenses the received laser light beams on the light entering surface of the multiplexing optical member,
wherein the multiplexing optical member multiplexes the laser light beams condensed by the first lens system, into a multiplexed laser light beam having a spatially-uniform intensity distribution,
wherein the second lens system condenses the multiplexed laser light beam that has exited from the light exiting surface of the multiplexing optical member onto the one or more kinds of phosphor, and
wherein the first lens system comprises a single lens that is larger than a maximum dimension of a surface shape of the light emission region in the package.

18. The light source unit according to claim 17,
wherein at a surface of the phosphor-containing region, the multiplexed laser light beam has a half width of a light intensity distribution at least 80% with respect to a width at an intensity of $1/e^2$ to the center intensity, where e is the base of the natural logarithm.

19. The light source unit according to claim 17, further comprising a fluorescence receiving lens, wherein:
the substrate is disposed with respect to the second lens system so that the multiplexed laser light beam is non-perpendicularly incident to the phosphors on the substrate surface, and the fluorescence is emitted in a direction different from the incident direction of the multiplexed laser light beam,
the second lens system comprises a single lens, and
the fluorescence receiving lens parallelizes the fluorescence emitted by the phosphor.

20. A light source unit that emits at least fluorescence, the light source unit comprising:
one or more kinds of phosphor;
a substrate, on which the one or more kinds of phosphor is applied;
a plurality of semiconductor laser elements arrayed at a predetermined interval in a package, wherein each of the semiconductor laser elements emits a laser light beam through a light emission region; and
a first optical system that comprises a first lens system, a multiplexing optical member having a light entering surface and a light exiting surface, and a second lens system,
wherein the first optical system directs the laser light beams emitted from the respective semiconductor laser elements toward the substrate,
wherein the first lens system receives the laser light beams emitted from the respective semiconductor laser elements directly without substantial parallelization of the respective received laser light beams, and condenses the received laser light beams on the light entering surface of the multiplexing optical member,
wherein the multiplexing optical member multiplexes the laser light beams condensed by the first lens system, into a multiplexed laser light beam having a spatially-uniform intensity distribution,
wherein the second lens system condenses the multiplexed laser light beam that has exited from the light exiting surface of the multiplexing optical member onto the one or more kinds of phosphor, and
wherein at a surface of the phosphor-containing region, the multiplexed laser light beam has a half width of a light intensity distribution at least 80% with respect to a width at an intensity of $1/e^2$ to the center intensity, where e is the base of the natural logarithm.

* * * * *